(12) United States Patent
Petrovic et al.

(10) Patent No.: US 6,977,556 B1
(45) Date of Patent: Dec. 20, 2005

(54) RATIONAL FREQUENCY SYNTHESIZERS

(75) Inventors: Branislav Petrovic, La Jolla, CA (US); Max Ashkenasi, La Jolla, CA (US)

(73) Assignee: Broadband Innovations, Inc., San Diego, CA (US)

( * ) Notice: Subject to any disclaimer, the term of this patent is extended or adjusted under 35 U.S.C. 154(b) by 0 days.

(21) Appl. No.: 09/580,513

(22) Filed: May 25, 2000

(51) Int. Cl.[7] ............................................. H03L 7/00
(52) U.S. Cl. ......................... 331/18; 331/1 A; 331/16
(58) Field of Search ........................... 331/1 A, 16, 18

(56) References Cited

U.S. PATENT DOCUMENTS 4,573,023 A * 2/1986 Cok et al. ................... 331/1 A

* cited by examiner

Primary Examiner—Arnold Kinkead
(74) Attorney, Agent, or Firm—Nath & Associates PLLC; Gregory B. Kang; Teresa M. Arroyo

(57) ABSTRACT

A single loop PLL frequency synthesizer for operation in the MHz to GHz range, suitable for integration in integrated circuits, operates at high comparison frequencies thus achieving superior phase noise performance, having wide loop bandwidths while able to tune in small frequency steps. It is based on the fact that the output frequency and the reference clock frequency always have a rational relationship, and so can always be represented as a ratio of two integer numbers. This ratio is expanded into various expressions of equivalent fraction expansions taking the form of a series of divided, added or subtracted terms, each being a rational number in itself. This ratio is realized in hardware through stages of frequency conversions using single sideband mixers (either the upper or lower sideband, and frequency dividers. This process of frequency translation thus generates the comparison frequency to which the PLL phase-locks the VCO.

24 Claims, 16 Drawing Sheets

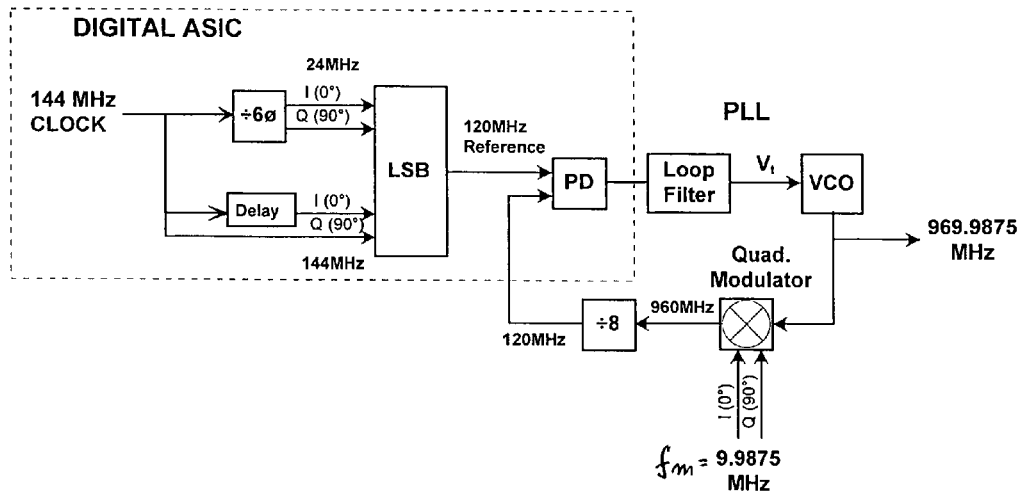
Figure 4a: LO1 generation
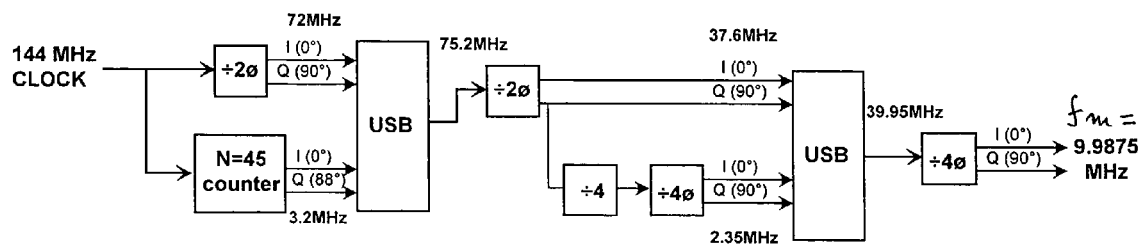
Figure 4b: 9.9875 MHz Offset for LO1 generation

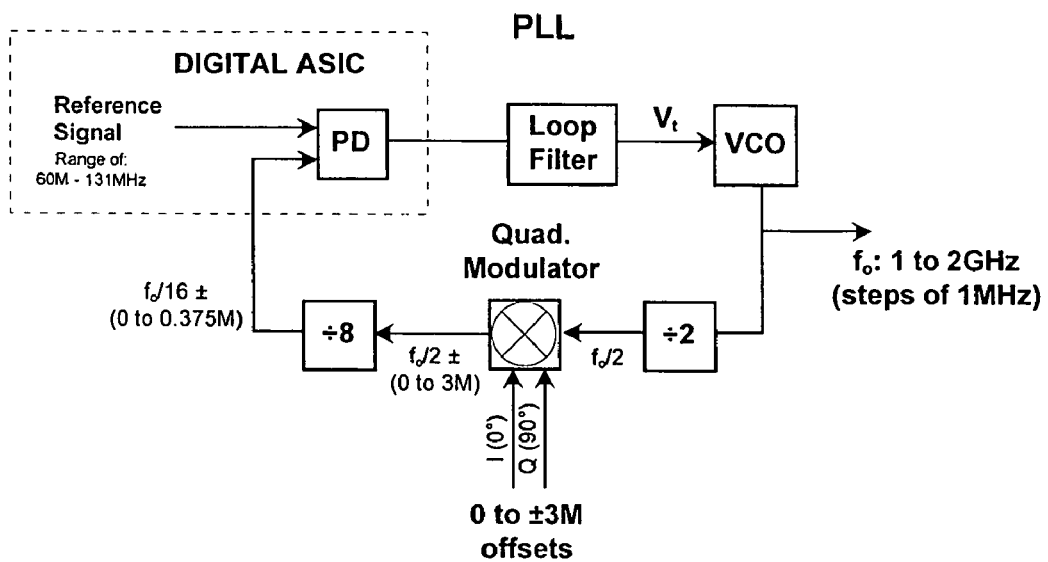
Figure 5a: LO2 generation

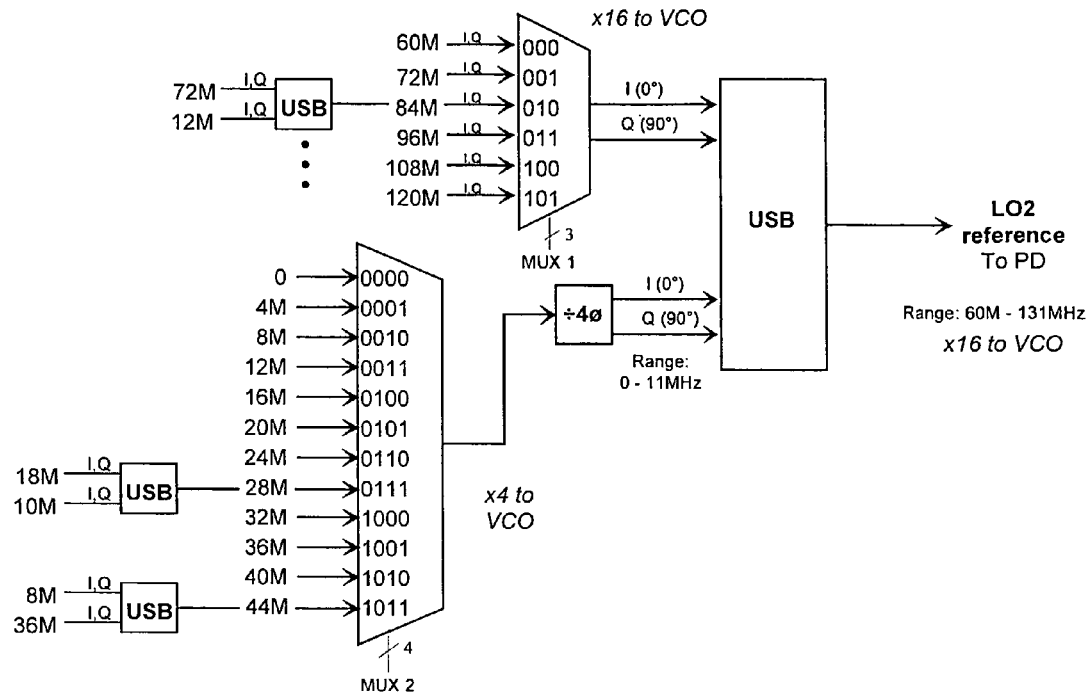
Fig. 5b - Generation of Reference frequency for LO2
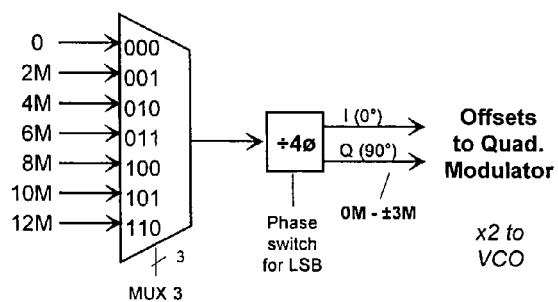
Fig. 5c - Generation of offsets for LO2

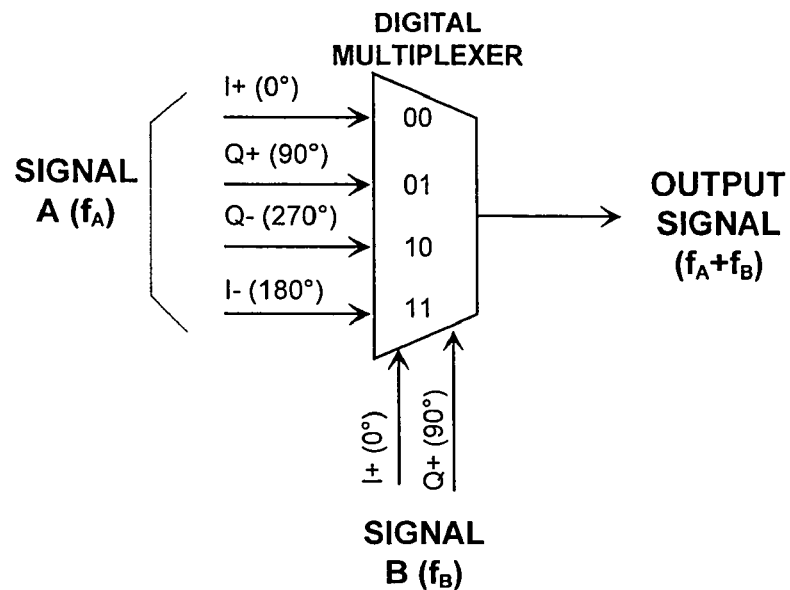
Figure 6a: USB generation block
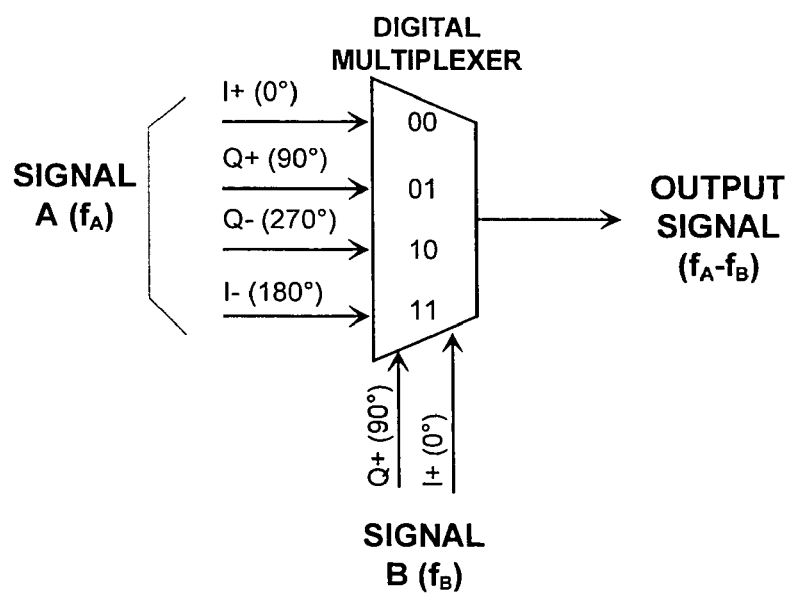
Figure 6b: LSB generation block
(notice that in Signal B, the two inputs are swapped)

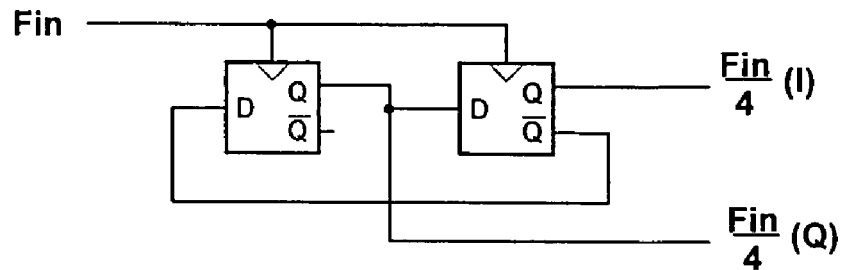
*Figure 7: Divide by 4∅ (quadrature outputs) - Prior art*
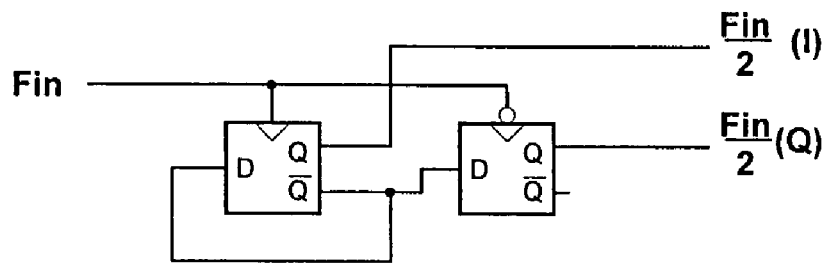
*Figure 8: Divide by 2∅ (quadrature outputs)*

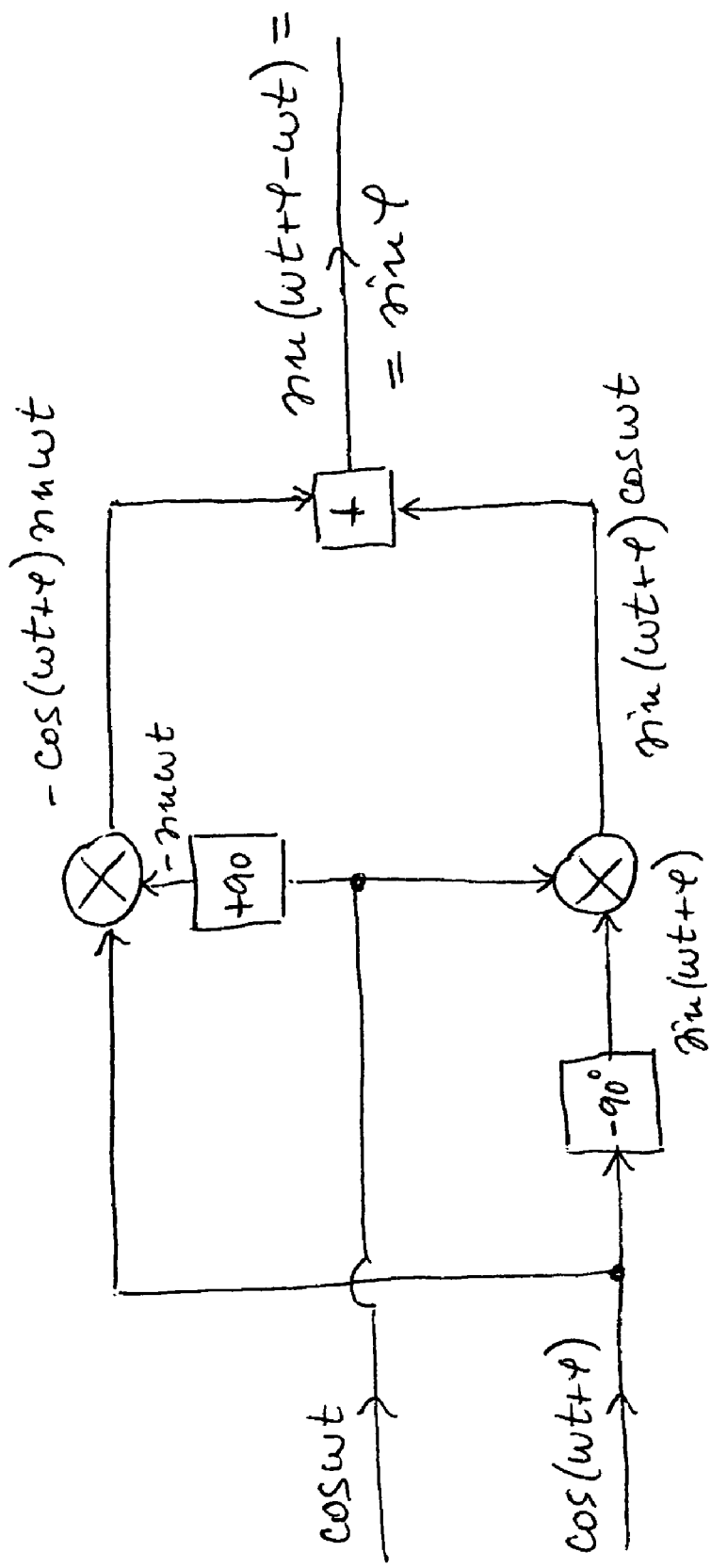
FIG. 11 PHASE DETECTOR EMPLOYING SSB MIXING

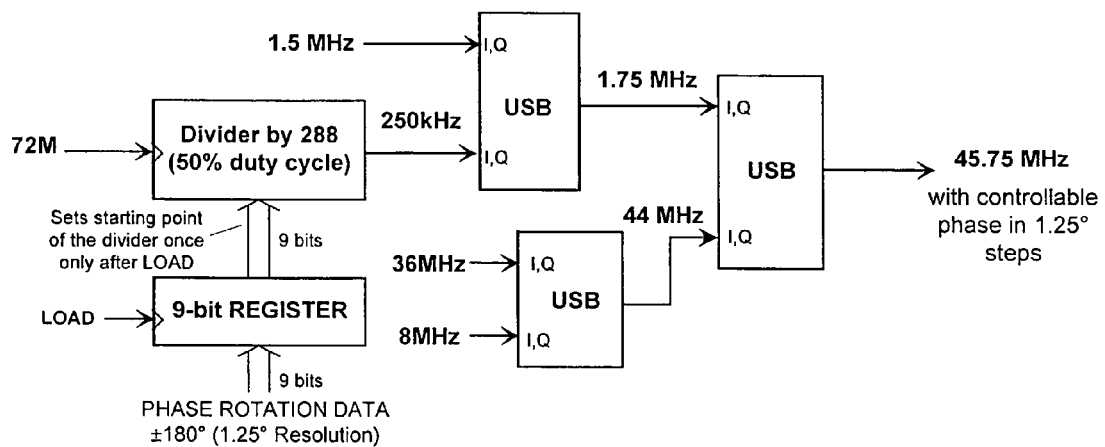
Figure 12 - Generation of 45.75MHz derived from 72 MHz, with controllable phase in (360°/288)=1.25° steps

RATIONAL FREQUENCY SYNTHESIZERS

BACKGROUND OF THE INVENTION

1. Field of the Invention

This invention relates to a new class of phase lock loop (PLL) frequency synthesizers utilizing very high reference clock frequency (in the order of 100 MHz, but not limited to) and very high comparison frequencies (of the same order as the reference clock frequency), but providing fine frequency resolution, where frequency steps increments can be orders of magnitude smaller (in the order of 10 kHz, but not limited to) than the comparison frequency, and especially to their use as single loop PLL frequency synthesizers having very low phase noise, thus offering significant performance improvements for advantageous applications such as cable television (CATV), high speed digital communications (digital TV and high speed cable data modems for internet applications), wireless communications and other consumer and commercial electronics devices in high frequency (HF), very high frequency (VHF) and ultra high frequency (UHF) bands and beyond, but which are simple and inexpensive to manufacture, and suitable for integration into modern integrated circuits, as a single-chip solution. In addition, this invention relates to the field of precision phase control of carriers in coherent multi-carrier transmission systems.

2. Background of the Related Art

Modern communication and other electronics systems often require generation of internal signals necessary for various processing functions, ranging from local oscillator sources for signal frequency up or down conversion or modulation/demodulation purposes, to various clock signals used by processors and controllers. Although the requirements regarding the quality and speed at which these signals are generated highly depend on the specific purity, and in the case of commonly used frequency agile systems in communications, the tuning speed at which the channel frequencies can be dynamically change may be important as well. As is well known in the art, it is the goal of frequency synthesizers to accomplish the above tasks. It is therefore a general requirement for synthesizers to be able, by using reference signal or signals, to generate spectrally clean signals (or stabilize other signals) at required frequencies, having spectral purity, phase noise and tuning speed characteristics that are consistent with the system and application requirements. Furthermore, it is the synthesizers that are often called upon to reject (i.e. attenuate) undesired components that may accompany a signal that is being synthesized, stabilized or synchronized. An example of such a case is when a synthesizer is used to reduce the relatively high close-in phase noise inherently present in voltage controlled oscillators (VCO). In addition, it is often desired, if not required that the synthesizer can perform (or assist in) phase or frequency modulation or demodulation. In specific applications utilizing large number of coherent carriers carried over various mediums, such as in fiber optic links and coaxial cable distribution plant used in cable television, precision phase control of the carriers may be desired for the purpose of improving distortion performance of the transmission system, and in such cases it would be advantageous if frequency synthesizer could accomplish the carrier phase control function as well.

In modern communication systems deploying phase or frequency modulation, such as quadrature amplitude modulation (QAM) used in digital cable TV and high speed data modems, quadrature phase modulation (QPSK) used in digital cellular telephony, FM modulation used in analog cellular telephony, and many other communication systems employing similar modulation formats, it is the phase noise performance of the synthesized signals that is becoming increasingly important with a specific reason to preserve system performance and prevent degradation. As is well known in the art, excessive phase noise of the sources used to process modulated signals that contain information in it's phase or frequency can cause degradation in signal to noise ratio (S/N) or bit error rate (BER) of the desired signal, resulting in reduced sensitivity and unsatisfactory system performance. This is particularly true in the systems utilizing narrow band transmission, such as lower deviation FM or lower symbol rate QPSK systems, where phase noise of local oscillators (LO) used to down convert RF signals to IF frequencies, or vice cersa, is effectively added to the demodulated signal carrying information, thus directly degrading the S/N or BER. In the systems with closely spaced channels, it is also possible that the LO phase noise can cause degradation in sensitivity due to adjacent channel interference, whereby the LO phase noise side bands can in the receiver down-convert the adjacent channel and place it directly on the desired signal and so cause interference, or in the case of a transmitter LO, the transmitted LO phase noise side band occurring at the adjacent channel frequency can cause direct interference in the receivers tuned to that adjacent channel frequency.

When discussing the phase noise, it is important to note that phase noise is random in nature, having continuous spectral distribution around the synthesized signal. It should be distinguished from discrete undesired sidebands that may also exist as various spurious components in the vicinity of the signal. As is well known in the art, the discrete spurious sidebands of the synthesized signal are none less important than the random phase noise sidebands, since they can cause similar, and in many cases even worse undesired effects. The burden is usually on the synthesizer to ensure that all the above requirements are met, emphasizing that the spectral purity and phase noise requirements are most often the governing factor in the system design and implementation choices. Finally, it is always desirable that the above functions are realized in an inexpensive, repeatable and easily manufacturable way.

There are two well known general techniques for implementing frequency synthesizers—direct synthesis and indirect synthesis methods. Various forms of the combination of these two techniques are also well known in the art. The direct methods include direct analog synthesis (DAS) and direct digital synthesis (DDS). The indirect methods primarily rely on utilization of phase lock loops (PLL).

The direct analog synthesis method generates the desired output frequency or frequencies by the combination of such means as analog up/down conversion, multiplication, filtering and attenuation/amplification of one or more reference signals. Frequency division may also be utilized, whereby digital dividers are primarily used.

The direct digital synthesis utilizes a sampled process, where digital words representing desired waveforms are computed and converted with the aid of a sampling clock to a desired analog signal in digital to analog converter followed by antialiasing filter.

The indirect synthesis technique utilizes a method where one oscillator (in single loop PLLs) or more oscillators (in multiple loop PLLs) are forced in a controlled way to be phase (and frequency) locked to one or more reference signals. While the phase locked loops are most commonly used to accomplish this task, other means, such as injection-locked oscillators (also known as synchronous oscillators) may also be used for this function.

Each of the above techniques has its advantages and disadvantages regarding frequency coverage, frequency agility and switching speed, phase noise and spurious sideband performance, power consumption, size, cost, manufacturability, repeatability etc. Many of these factors are contradictory in nature to each other, and it is the matter of intended application that will govern the considerations and choices as to which method or methods is the most suitable to use. Although the characteristics of each of the techniques regarding these factors are well known in the art, for the purpose of completeness of the discussion, the key characteristics for each of the methods is summarized below:

DAS—possibly the best spectral purity (phase noise, close-in spurs) and fastest switching time attainable, wide frequency coverage but limited frequency agility, larger size, higher complexity and cost, may require adjustments in manufacturing—in general not suitable for large volume, low cost applications.

DDS—very good noise and close-in spectral purity performance, fast switching with continuous phase capability, excellent agility but limited frequency coverage (currently at about 100 MHz practical implementation limit), medium to high cost (increases with frequency), could be used in limited number of high volume applications.

PLL based frequency synthesizers—moderate to good noise and close—in spur performance, slow to medium switching speed, wide frequency coverage and agility (usually limited by VCO), lowest to medium cost, moderate to good repeatability, low power.

The single loop PLL based frequency synthesizers are by far the most widely utilized type in large volume communications systems applications, since in most cases they offer the best compromise of all of the above competing factors (i.e. low cost, simple construction with low parts count and low power consumption, acceptable performance levels). We will hereinafter in the background discussion focus on the single loop PLL type of synthesizers, with the emphasis on the shortcomings in the prior art of this type, as some of these shortcomings are the subjects being addressed by the present invention.

PLL synthesizers, as mentioned earlier, operate on the principle of phase locking an oscillator (or multiplicity of) to a reference signal (or signals). To simplify the following description, we will narrow the discussion (but not limit to) a case involving only one oscillator and one reference signal source.

In general, every PLL represents a closed loop negative feedback control system, where the controlling variable is the phase of the controlled element, and a controlled element is an oscillator with variable frequency capability, most often of the VCO type. Such a feedback system requires a mechanism to generate an error signal, upon comparing the controlling variable (oscillator's phase) with the equivalent parameter of the reference (reference's phase). This error signal is by the means of a loop filter converted into a control signal, which is in turn used to steer the oscillator in the direction that reduces the error signal towards zero or some finite value.

In a PLL, the error signal is generated by the phase comparator (phase detector). The phase detector compares the phase of the oscillator with that of the reference signal, and provides an error signal proportional to the phase difference. The error signal is further conditioned by the loop filter. The loop filter usually consists of either a passive or active single or multiple pole filter, which may be followed with an amplifier, to produce a control signal. Applying this control signal from the output of the loop filter to the tuning line of the oscillator, closes the feedback loop, and completes the PLL circuit. However, before a phase lock can occur, a frequency lock must occur. During acquisition of phase lock, depending upon the amount of frequency difference between the reference and oscillator signals, the phase detector alone may not provide an adequate steering signal that will guide the frequency of the oscillator in the right direction, and for the purpose of assisting, or enabling acquisition, the so called phase-frequency detectors (PFD), or other means such as frequency pre-tuning or frequency sweeping are utilized. In the acquisition stage, the PFD (or above mentioned other means) provides a DC steering signal of the right polarity, consistent with the sense of the frequency difference, which guides the oscillator in the correct direction towards a lock.

The ability of the loop to correct any fluctuations of the phase that the oscillator may have depends upon a loop bandwidth (LBW) of the loop. Within the LBW, the loop will substantially eliminate (i.e. reject) any phase fluctuations (phase noise) that the oscillator itself may have, while the oscillator will "copy", i.e. track the phase of the reference. It will also track any noise that falls within the LBW generated elsewhere in the loop (e.g. the noise of the phase detector). This noise is added to the phase noise of the reference signal. The loop will multiply this combined noise by a factor which equals to Ntot (total division ratio in the loop), and then phase modulate the VCO with this multiplied noise. As will be shown later, this noise multiplication is often the key factor causing degradation of phase noise performance in synthesizers.

Typically, the desired output frequency of the oscillator differs from that of the reference frequency. Furthermore, in agile systems the oscillator needs to be tunable to different frequencies at different times. For this purpose, some sort of programmable frequency scaling is required. This function is accomplished by the means of so called prescalers (either of a fixed or of a variable division ratio, or modulus) and programmable counters. Since programmable counters have limitations in terms of the upper frequency limit where they can operate, often prescalers are used to scale the oscillator frequency down and bring it within the operational frequency range of the programmable counters.

Often it is necessary to scale down the reference frequency as well, so that the reference frequency is divided down to a lower frequency, referred to as a comparison frequency, which is the frequency at which the comparison of the phase (and frequency) of the scaled versions of both the oscillator and reference signals actually occurs. In the lock conditions, the scaled frequencies of the oscillator and reference signals are made equal by the PLL action, and the frequency relationships are expressed with the following equations:

$$fc = \frac{fr}{R} \qquad (2)$$

where fosc is the oscillator output frequency and Ntot is the total division ratio of the oscillator signal, ft is the reference frequency, R is the division ratio of the reference frequency, and fc is the comparison frequency.

As is well documented in the literature related to the art, the primary cause of phase noise at the output of the synthesized oscillators s the combination of the residual VCO phase noise (the portion of the oscillator noise that is not rejected by the loop), and the noise power of the loop components (such as dividers and phase detectors). This loop noise is multiplied by the loop by a factor of $Ntot^2$, or $20 \cdot \log(Ntot)$. Any random noise and discrete spurs occurring at the output of the phase comparator within the LBW will be multiplied by this factor and then applied to the oscillator where the phase modulation of the oscillator by these signals will occur. Outside of the LBW, the loop will attenuate such signals according to the transfer function of the loop. In the case of relatively low comparison frequency fc and relatively high oscillator frequency fosc, the $20 \cdot \log(Ntot)$ figure can amount to a very large quantity, exceeding the residual VCO phase noise and thus becoming a dominant and limiting factor in the ultimate noise performance achievable in the system.

One example of adverse effects of noise multiplication (or noise gain) in the loop is in the cable television systems, where channel frequency spacing is 6 MHz, but the channel carrier frequencies must be integer multiples of 12.5 kHz (in a standard frequency plan, most channel frequencies are multiples of 0.25 MHz, but due to regulatory requirements by Federal Communication Commission—FCC, a few channels must be offset from this frequency grid by 25 kHz, and some other channels by 12.5 kHz; furthermore, some cable TV systems use a frequency plan where all channels are offset by 12.5 kHz from a standard plan—the so called "incrementally related carriers"—IRC plan). To accommodate these channel frequency requirements, a comparison frequency of 12.5 kHz is required. For a local oscillator operating around 970 MHz in a cable head-end modulator, or in a set-top converter, the noise multiplication figure will amount to 98 dB. Another example of noise multiplication is in an oscillator, synthesized at about 900 MHz, with step size of 30 kHz, common in cellular telephony. This step size will demand a comparison frequency of 30 kHz, and the noise multiplication figure in this case will be close to 90 dB. The noise gain of this magnitude can place severe limitations as to the achievable phase noise performance in the system, such as in the above two examples.

By examination of equation (1) and (2), it becomes evident that the frequency step resolution, i.e. the minimum achievable frequency increment of the oscillator frequency is the function of both the comparison frequency fc and the minimum available increment of the division ratio Ntot, as expressed in the following equation:

$$\Delta fosc = fstep = \Delta Ntot \cdot fc \qquad (3)$$

where $\Delta fosc = fstep$ is the minimum achievable frequency increment of the oscillator frequency and $\Delta Ntot$ is the minimum available increment of the total divider count Ntot. By examining equation (3), it becomes clear that if Ntot is an integer (and therefore having a minimum increment of $\Delta Ntot=1$) the smallest achievable step size $\Delta fosc = fstep$ is equal to fc. Furthermore, from equation (1) it follows that Ntot being an integer also implies a required integer relationship between fosc and fc.

Another adverse effect of low comparison frequency indirectly affects the switching speed. It is well known in the art that the switching speed is inversely proportional to the loop bandwidth LBW. It is often the case that the LBW must be substantially lower than the comparison frequency, since the signals with the energy at the comparison frequency may occur in the loop, due to the leakage of this frequency from the phase comparator. To prevent phase modulation of the oscillator and resulting discrete sidebands of the oscillator, the loop must attenuate the undesired energy at fc frequency, and to do so it may be necessary to reduce the loop bandwidth far below the fc frequency. While reducing the LBW may eliminate the unwanted sidebands, it will also reduce the switching speed of the synthesizer. Reduced LBW may also reduce the rejection of the internal oscillator phase noise, which is otherwise eliminated by the loop. To address the switching speed, many synthesizer designs often include dynamically switched LBW—a wide one and a narrow one. The wide bandwith is selected during acquisition stage to speed up the acquisition, upon which a narrow bandwidth is switched-in for normal operation. While in this way the switching speed is improved, the oscillator noise rejection remains poor with narrow LBW.

Another adverse effect associated with narrow LBW is related to phase modulation of the oscillator due to mechanical shock or vibration (referred to as microphonics). In general, mechanical vibration can cause parametric modulation of various components of a PLL (such as varactor diodes, inductors, etc.), which can result in phase modulation of the oscillator. The loop will reject the spectral energy of the mechanical vibration within the LBW, but outside the LBW, the loop will not be able to protect the oscillator of being phase modulated by the vibration. Therefore, wider loops are more resistant to shock and vibration, and narrower loops less.

Returning back to the discussion on the available types of PLL synthesizers, it is important to note that the solution for low cost, small size and low power consumption in modern, consumer type communications system relies on the ability to integrate the entire synthesizer, short of the oscillator, on a single integrated circuit, i.e. the application often requires the so called single-chip solution. Some more advanced applications are demanding the integration of the oscillator, too, on the chip.

There are three types of the single loop PLL synthesizers presently used as a single-chip low cost solutions in the art, and they primarily differ from each other in the way the Ntot division ratio is accomplished. The three types are the following: the fixed modulus prescaler type, the dual modulus prescaler type and the fractional_N type PLL synthesizer.

The fixed modulus prescaler contains a fixed prescaler with division ratio P, where $Ntot=P \cdot N$ and N is a programmable counter division ratio. Per equation (3), the minimum increment is limited to $P \cdot fc$. As an example, if P=10 and step size is to be 30 kHz, the comparison frequency fc needs to be as low as 3 kHz, which will cause an increase of noise gain in the loop by another 20 dB in the previous example. Clearly, the limitation of this type of the synthesizer only aggravates the issues discussed above, and in many applications it can not provide the satisfactory performance.

The dual modulus prescaler type offers a division ratio of $Ntot=N \cdot P+A$, such that the output frequency is defined by:

$$fosc=(N \cdot P+A) \cdot fc \qquad (4)$$

The minimum increment with this type of synthesizer is equal to comparison frequency $\Delta fosc=fstep=fc$, since A is an integer which can be incremented by 1. This synthesizer operates on the principle of dual modulus prescaling, whereby the fosc is first divided by (P+1) for A cycles of the divided signal, and then the modulus is switched to P, for subsequent (N−A) pulses of the divided waveform. The total pulse count in one full division cycle is therefore $A \cdot (P+1)+(N-A) \cdot P = N \cdot P + A$. This type of synthesizer is widely used and presents the "work horse" of the industry.

The fractional_N type synthesizer (FNS) represents the current state of the art in the field of a single-chip PLL frequency synthesis. IT is the only type that offers non-integer division ratios, and therefore offers higher comparison frequency than the step size. Currently the available FNS integrated circuits offer sub-integer ratios of 1/5 and 1/8 allowing for output frequency increments equal to fc/5 or fc/8. The increased comparison frequency by a factor of 8 will reduce the noise multiplication figure by 18 dB, but nevertheless, the multiplication factor will still remain relatively high.

The FNS presents an augmentation of the dual modulus prescaler synthesizers. The capability to divide with non-integer numbers is effectively accomplished by varying the total division ratio as function of time, whereby the total division ratio is not held constant at Ntot, but rather it is dynamically changed in time from Ntot to Ntot+1 and vice versa, in a controlled way, such that an average division ratio that is not an integer, but rather a fractional number is obtained. The principle of operation of fractional_N synthesizer can be better understood by referring to FIG. 1, where a functional block diagram of an FNS is illustrated. As shown in this figure, the augmentation portion that is responsible for the extension of the regular dual modulus prescaler synthesizer into a fractional_N type synthesizer contains a phase accumulator with modulo M division ratio, a fraction register F and a compensation DAC. Modulo M phase accumulator counts pulses as they arrive from the N counter and effectively divides this pulse rate by a factor equal to M. Normally, the systems divides by Ntot=N·P+A, in the same way as regular dual modulus type. However, every time the M counter reaches a value equal to F, which is a value preset by a fraction register F, the M counter issues one overflow pulse that sets the dual modulus prescaler to divide by (P+1) for one extra cycle of the divided signal, effectively increasing A to A+1. The system then starts dividing by Ntot+1=N·P+A+1, but only until the next pulse from the N counter, which restores the divide by (P+1) cycle back to A, at which time the system switches back to normal division rate of N·P+A. The system continues to count at this normal rate until the next overflow pulse from the M counter, when it switches to Ntot+1 rate, and the whole cycle repeats again.

The output frequency of fractional_N synthesizer is given by:

$$fosc = \left(N \cdot P + A + \frac{F}{M}\right) \cdot fc \quad (5)$$

where M is the modulus of the phase accumulator and F is the fraction register value. The frequency increments of $\Delta fosc=fstep=fc/M$ are available. Varying F from 0 to M−1, contiguous steps are possible.

Examining the division rate as a function of time, it becomes clear that only the average frequency at the output of the programmable N counter equals that of the comparison frequency, while the instantaneous frequency (i.e. the instantaneous pulse rate at the N counter output) is never equal to the comparison frequency fc, which has a constant, uniform pulse rate. The N counter output pulse rate alternates in time between the two values, one equal to fosc/(Ntot1) and the other to fosc/Ntot. The phase/frequency detector PFD sees on one side a uniform pulse rate fc coming from the reference divider R, and on the other side a variable frequency coming from the N counter. Since these two rates are never the same, the phase detector at the end of each comparison cycle always issues an error signal, equal to the phase discrepancy of the two signals at the end of that comparison cycle. This error signal needs to be completely removed from the loop, otherwise severe phase modulation of the oscillator would occur (it can be shown that the accumulated phase error in one complete fractional cycle amounts to 360° at the oscillator frequency). The removal of the phase error signal is accomplished by the means of the compensation DAC which injects correction signals directly into the loop. On a cycle by cycle basis, the phase error is substantially predictable and it can be precisely determined as a function of count state of the M counter. The compensation DAC can therefore be directly driven by the M counter. At each comparison cycle the DAC generates a precise charge matched to the instantaneous phase error and attempts to cancel this phase error. The required precision of the correction charge is substantial. As an example, for 60 dB sideband purity of the oscillator, matching of the correction pulses and phase error in the order of 0.1% is required. Although it is achievable in the state of the art FNS ICs, it is often difficult to maintain this kind of precision over wide frequency range and temperature range since both the compensation DAC and PFD will exhibit some variations due to these factors. This is primarily due to the effect of temperature on propagation delays within the IC in the PFD, as well as effects of both the frequency and temperature on the current sources used in the compensation DACs. For wide tuning range oscillators, it is often necessary to provide an external adjustment for the compensation current of the DACs in the application circuit (outside of the IC), which may complicate the manufacturing process. Due to these factors, the ultimate phase error compensation is limited, and to ensure sufficient spectral purity of the oscillator, the loop filter often must be called upon to assist in further reduction of the sidebands, resulting in the LBW having a cut-off much below the fc/M, i.e. much below the step increment frequency. The reduced LBW, as mention earlier may adversely affect both the switching speed and the rejection of the internal oscillator phase noise. There are efforts in the art of fractional_N synthesis to improve phase error correction methods and alleviate some of the problems discussed above. More advanced approaches include utilization of higher order sigma-delta modulators in the role of a compensation DAC, which should push the phase error energy out of the loop bandwidth, towards higher frequencies by proper noise shaping of the correction pulses.

Finally, it should be mentioned that all of the above discussed prior art synthesizers use a phase-frequency detector which is inherently limited in speed. The type of the PFD used in the prior art relies on flip-flops with reset line fed back from the output. The propagation delay and set-up and hold times of this circuit limits the maximum speed (or frequency) of the PFD operation. Further more, in phase lock condition, there is a well known phenomena called a "dead zone". This is a point where phase detector gain goes to zero, which can cause instability in the loop, resulting in random phase fluctuation (low frequency phase noise) of the oscillator.

Thus, those of skill in the art will recognize the need for an alternative solution in the PLL frequency synthesis, one that can operate at much higher comparison frequencies, thus substantially improving phase noise performance, and at the same time providing fine frequency step increments of the output oscillator frequency.

SUMMARY OF THE INVENTION

It is therefore an objective of the present invention to provide a single loop PLL frequency synthesizer which uses very high reference clock frequency (in the order of 100 MHz, consistent with the current state of the art of the integrated circuits technology, but inherently not limited to this operating frequency) and operates at very high comparison frequencies (of the same order as the reference clock frequency) thus substantially reducing the total division ratio Ntot, and therefore proportionally reducing the noise multiplication factor in the loop, resulting in improved phase noise of synthesized signals.

It is another objective of the present invention for the synthesizer to, concurrently with the first objective allow for fine frequency resolution increments of the output oscillator frequency (in the order of 10 kHz, but inherently not limited to this order), i.e. orders of magnitude smaller than the comparison frequency.

It is yet another objective of the present invention to utilize high speed digital XOR gates, operated in a single sideband (SSB) mode as the means for phase comparison, thus further reducing the noise levels in the loop and freeing the loop of the "dead zone" effects.

This, and other objectives in the present invention are achieved by the means of frequency translation (or frequency conversion) combined with frequency division (combination of frequency translation and division is referred hereinafter as the process of "Frequency Ratio Generation") of the reference frequency and/or of the oscillator frequency, through multiple consecutive up or down conversions of these frequencies, using SSB mixers (where either the upper sideband—USB, or the lower sideband—LSB is selected by the frequency control means), in combination with programmable frequency dividers or counters, where the converted and/or divided frequencies are compared in a phase detector, followed by a loop filter in a closed loop manner that provides phase locking of the oscillator.

It is another objective of the invention to, by internal waveforms synthesis, mathematical algorithms, computation, analysis and by other means in the design process determine and choose the optimum fractional expansions representing the ratio of oscillator and reference frequency, for each and every synthesized frequency, and so obtain the bases for the hardware implementation and design, where the computation in the design stage includes the spectral purity analysis of each and every frequency, using such means as computation of time domain waveforms and division of, Fast Fourier Transform (FFT), inverse FFT and other means, with the goal to choose the optimum or minimum hardware configuration of the synthesizer, one which meets the criteria of best spectral purity in the frequency range of interest (usually in the vicinity of the LB W), such as to minimize the spectral energy occurring at frequencies equal to step frequency fstep and it's harmonics, so that the loop bandwidth of the synthesizer's PLL can be maximized, possibly to values greater than the frequency of the step size increment.

It is yet another objective of the invention to develop and implement frequency control algorithms and store all necessary instructions and values in non-volatile memory for on-board controller or micro-processor, in order to generate necessary frequency control signals for the synthesizer's hardware.

It is further objective in the present invention to utilize the bi-level (digital) circuits to accomplish all functions, or, in the cases where it is not feasible due to the speed (frequency) limitations in the current state of the art digital integrated circuit technology, use the combination of analog, radio frequency (RF) and digital circuits in one embodiment of the invention, where analog functions can be implemented by using standard analog/RF integrated circuits, and digital functions can be implemented in either standard Field Programmable Gate Arrays (FPGA) or custom Application Specific Integrated Circuit (ASIC).

It is another objective to embody the present invention in a form suitable for integration on a single chip integrated circuit, with minimum required support circuitry, either digital-only IC, or mixed analog/digital IC.

It is yet another objective of the present invention to provide a PLL frequency synthesizer capable of supplying an oscillator signal with precisely controlled phase and ability to control (increment/decrement) the phase in fine steps.

These and other objectives will be clear to those of skill in the art in view of the detailed description of the invention.

BRIEF DESCRIPTION OF THE DRAWINGS

FIG. 4a is an example of the functional block diagram of a 969.9875 MHz frequency synthesizer, using an external analog (RF) quadrature modulator IC operated in SSB mode to provide a translation of the VCO frequency, followed by a fixed digital divide-by-8 integrated circuit in order to scale the frequency down to about 120 MHz, which is within the operating range of a chosen digital ASIC (or FPGA).

FIG. 4b is an example of a generation of 9.9875 MHz signal used in conjunction with a synthesizer of FIG. 4a FIG. 5a is an example of the functional block diagram of a wide range tunable synthesizer, operating in 1 GHz to 2 GHz frequency range, with 1 MHz step resolution.

FIG. 5b is an example of a generation of a range of different frequencies used in conjunction with a synthesizer of FIG. 5a FIG. 5c is another example of a generation of a range of different frequencies used in conjunction with a synthesizer of FIG. 5a FIG. 6a is a block diagram of a digital single sideband mixer (SSB) with quadrature phasing selected for upper sideband (USB) output FIG. 6b is a block diagram of a digital single sideband mixer (SSB) with quadrature phasing selected for lower sideband (LSB) output FIG. 7 is a block diagram of a divide-by-four digital circuit of the prior art, which provides quadrature output signals (I=0° in phase and Q=90' quadrature signal)

FIG. 8 is a block diagram of a divide-by-two digital circuit which provides quadrature output signals (I=0° in phase and Q=90' quadrature signal)

FIG. 11 is a block diagram of a phase detector employing SSB mixing of the two compared frequencies, where each frequency has quadrature signals (I=0° in phase and Q=90' quadrature signal).

FIG. 12 is a block diagram of a digital phase-shift circuit, which provides the phase control capability.

DETAILED DESCRIPTION OF THE INVENTION

Figure 1:
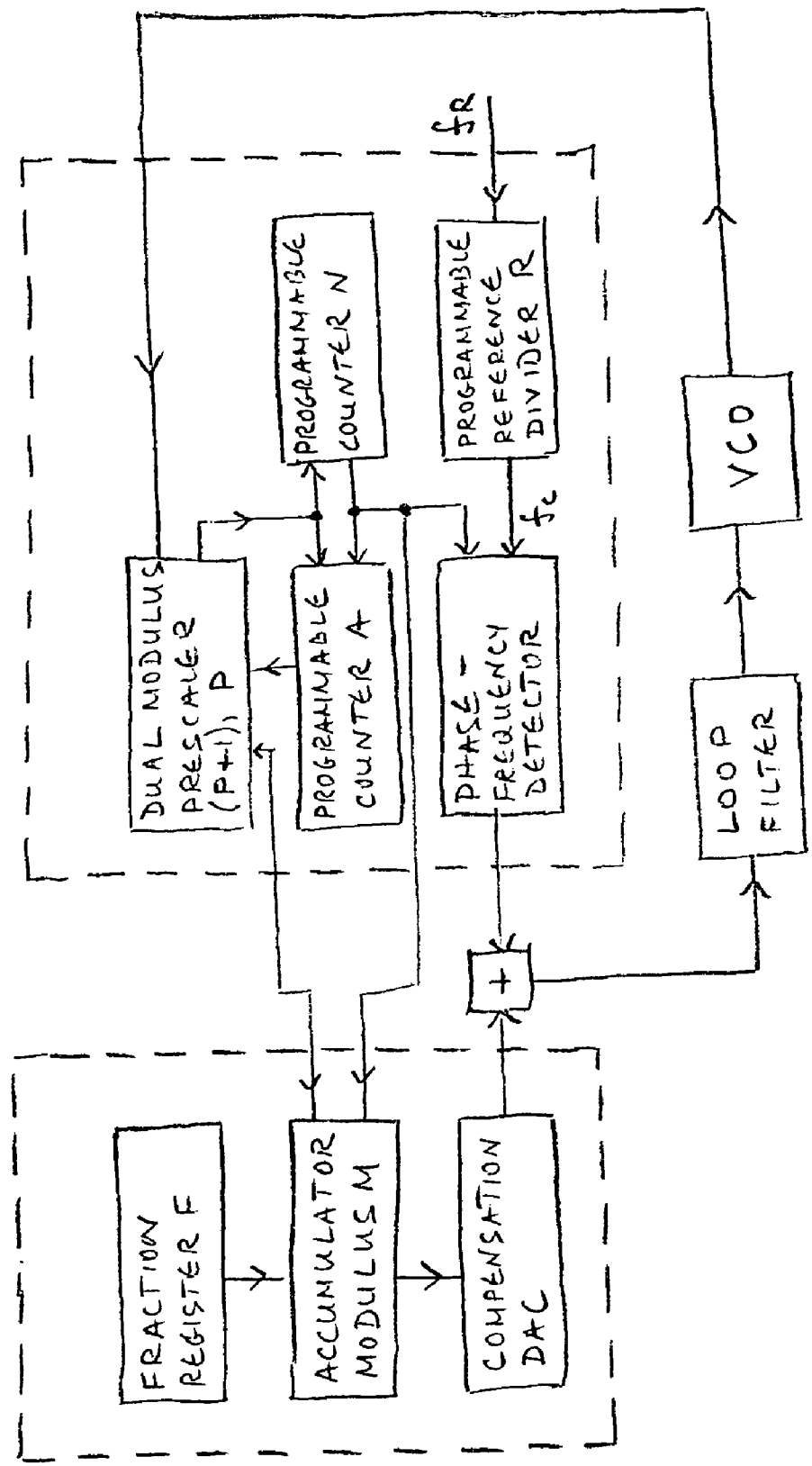
FIG. 1 is an illustration of a functional block diagram of a fractional_N type frequency synthesizer of the prior art.

The heart of the present invention is the Frequency Ratio Generator (FRG). The basic principle of operation of the FRG relies on the fact that output frequency (oscillator fosc) and input frequency (reference clock fref) always have a rational relationship, i.e. the ratio of the two can always be represented as a ratio of two integer numbers, P and Q, as shown in equation (6):

$$fosc/fref=P/Q \text{ or } fosc=fref*P/Q \qquad (6)$$

Alternatively, fosc/fref ratio can be expressed as a combination of two fractions, per eq. (6a):

$$fosc*P1/Q1=fref*P2/Q2 \qquad (6a)$$

which is equivalent to factoring P/Q into:

$$P/Q=(P2*Q1)/(P1*Q2) \qquad (6b)$$

If the ratio P/Q can be realized in hardware, such that a frequency equal to fref*P/Q is generated, then all what it would take to realize eq. (6) would be to use a PLL and phase lock the oscillator to this frequency. The manner in which the FRG accomplishes this goal is described below.

It is well known in the science of mathematics that any rational number P/Q can be expanded into various equivalent fractions. The equivalent fractions take a form of a series of divided, multiplied, added or subtracted terms, each term being a rational number itself. A simple example of such expansion is 3/2=1+½. There are numerous possible fraction expansions, but here we are interested in those expansions which are most suitable for implementation in hardware. Examining the four arithmetic operations and the feasibility to implement them in hardware, and keeping in mind that the variable which is being operated upon is frequency, the following can be found:

Addition: addition of two frequencies f1+f2 requires a single side band (SSB) mixing, where upper sideband (USB) is used. It is well known in the art of frequency conversion that the SSB mixing of two frequencies produces only one dominant frequency, equal to either the sum or the difference of the two frequencies, depending upon which sideband (upper or lower) is produced. For SSB mixing, quadrature signals (0° and 90° phase signals) of both f1 and f2 frequencies is required. This requirement poses some constraints, which will be reviewed later in the discussion on implementation details. Alternatively, a double sideband (DSB) mixing followed by a band pass filter tuned to a desired sideband (and rejecting the unwanted one) can be used, however this approach is not suitable for integration in integrated circuits, primarily because of a need for external filters.

Subtraction: difference of two frequencies f1−f2 can be obtained by SSB mixing, where lower sideband (LSB) is used.

Multiplication: multiplication of one frequency by an integer—there is no easy way to accomplish this in hardware (a separate PLL with dividers in the loop, or a harmonically locked injection-locked oscillator may be needed to accomplish this function). Multiplication by a factor of 2 is somewhat easier to implement directly, but in general, fraction expansions requiring multiplication are not preferred.

Division: division of a frequency by an integer—well known dividers or counters can be used for this function.

It follows that expansions using addition, subtraction and division are preferred, and clearly those having fewer number of terms (minimum expansion length) are favored.

One preferred type of fraction expansion that meets the above criteria is expressed in equations (7):

$$fosc/fref=P/Q=1\pm 1/p1\pm 1/p2\pm 1/p3\pm \ldots \pm 1/pn \qquad (7)$$

where pi, i=1,2,3, . . . , n are positive integer numbers.

Another type of preferred expansion is shown in eq. (8):

$$fosc/fref=P/Q=1\pm 1/q1(1\pm 1/q2(1\pm 1/q3( \ldots 1\pm 1/qn)) \ldots ) \qquad (8)$$

where qi, i=1,2,3, . . . , n are also positive integer numbers.

Further types of preferred expansions include expansion of both fosc and fref frequencies, per eq. 6a, where both P1/Q1 and P2/Q2 are rational fractions, and each can be expanded into fractions like one in eq. (7) or eq. (8).

A combination of the above equations, where part of the desired signals is synthesized per eq. (7) and part per eq. (8) is yet another preferred fraction expansion.

Figure 2:
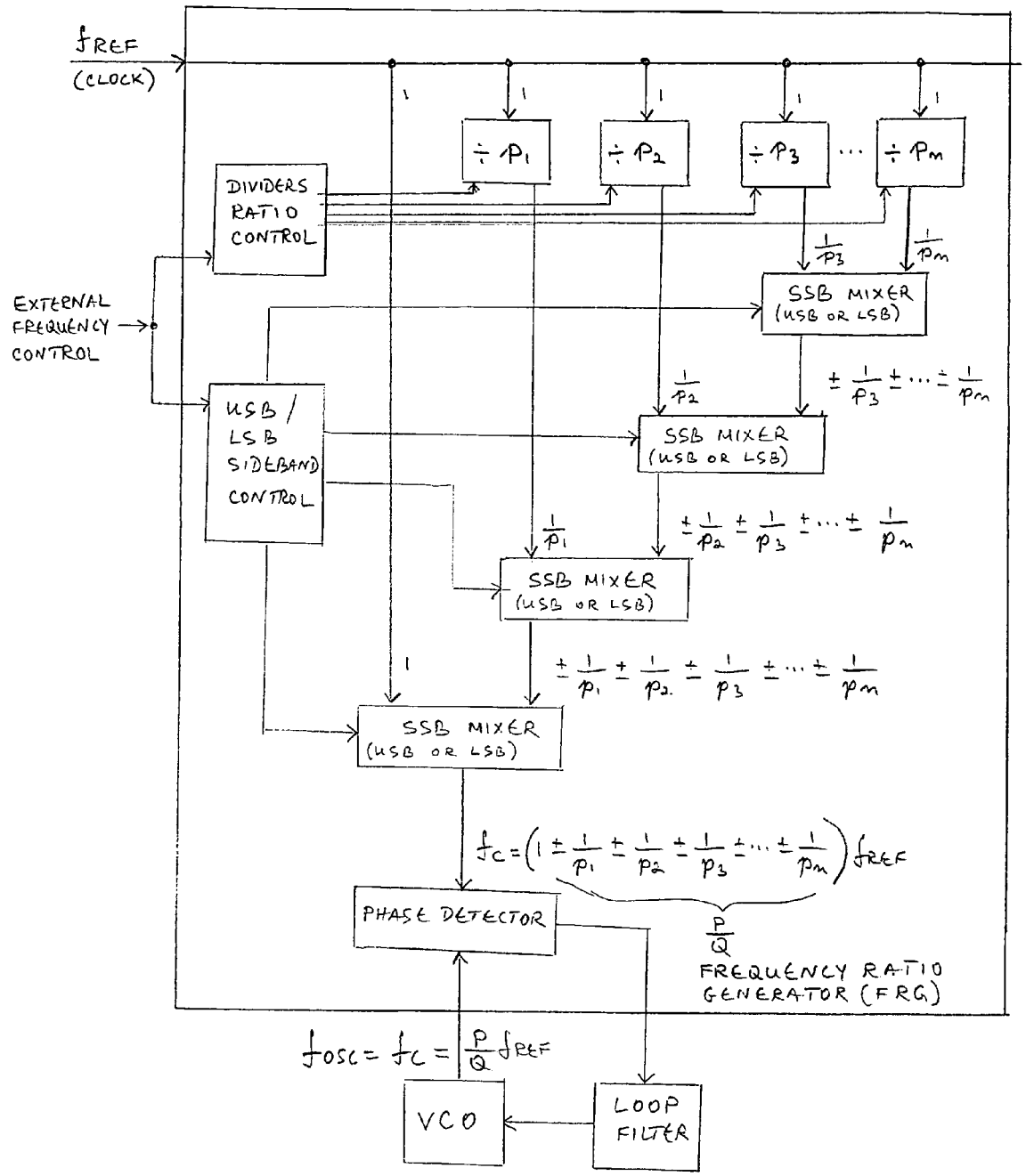
FIG. 2 is an illustration of the functional block diagram of one embodiment of the present invention using one type of fractional expansion formula in the frequency ratio generator.
Figure 3:
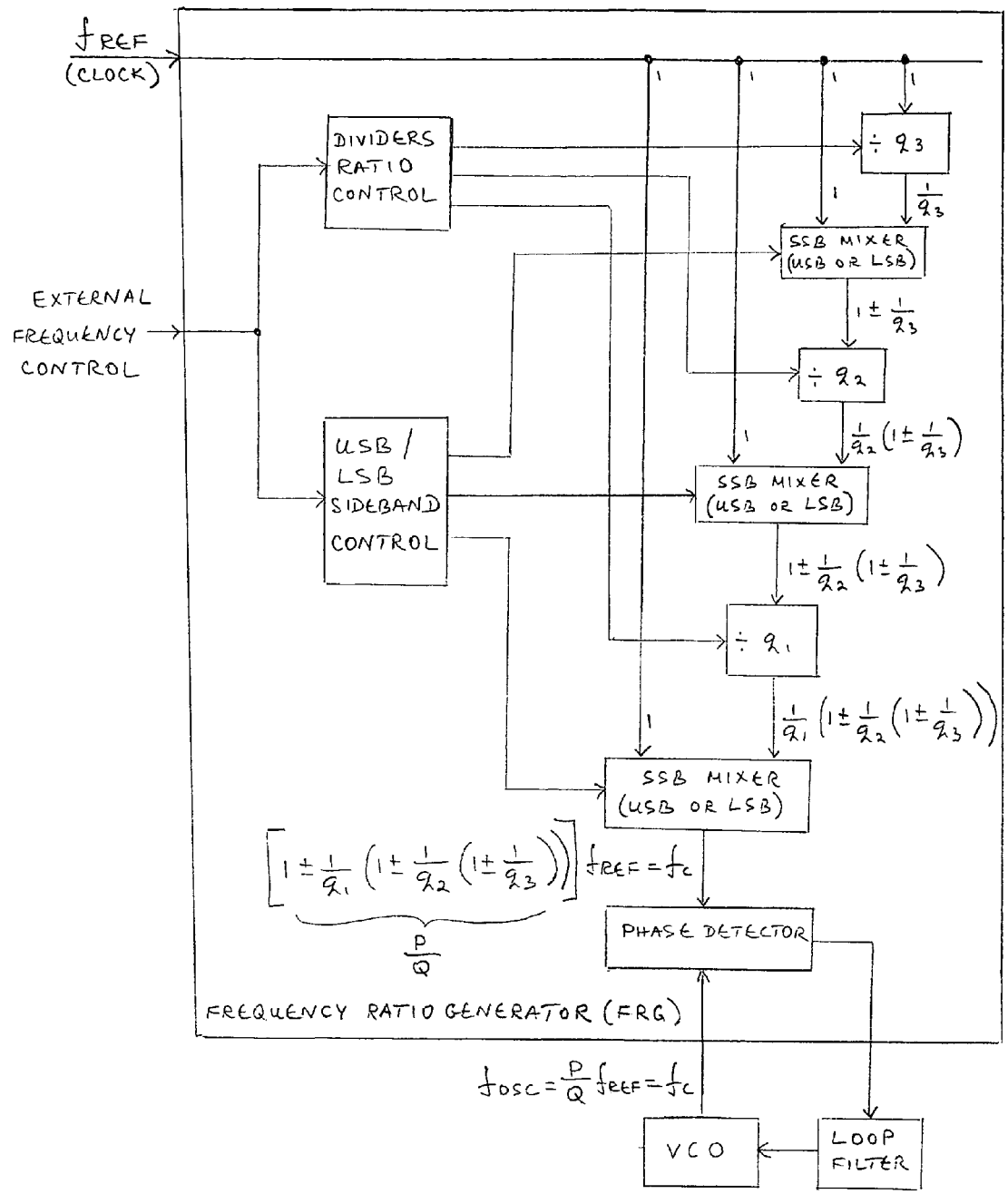
FIG. 3 is an illustration of the functional block diagram of another embodiment of the present invention using different type of fractional expansion formula in the frequency ratio generator.

The manner in which equations (7) and (8) are realized in hardware in the FRG of the present invention is illustrated in FIG. 2. and FIG. 3. respectively. Realization of other equations per above, or the combinations of, can be obtained in a similar fashion. Key building blocks in hardware realization are the SSB mixers, for frequency addition/subtraction, and dividers for frequency division. Each of the inputs to SSB mixers contains two signals—in phase and quadrature (not shown in the figures for simplicity). To obtain the quadrature signals, either a deilay line having a delay equal to 90° phase shift at the operating frequency (which is not inherently broad-band, since a phase shift of a delay line will vary with frequency of the signal), or a divide-by-two divider circuit can be used, as shown later in one of the embodiments of this invention. This requirement will put a constraint on the coefficients pi or qi in the fraction expansion, namely, the coefficients would need to be even numbers, i.e. divisible by two.

The block diagrams in the FIGS. 2 and 3 can be directly constructed by following the formulas in eq. (7) and (8), respectively, with the addition of a loop filter and an oscillator, to complete a PLL circuit. The mechanism for frequency acquisition of the PLL is not shown in the figures, since the acquisition is not the focus of this invention. However, should assistance for frequency acquisition be needed, some of the well known techniques in the art, such as a frequency discriminator, which is turned-off upon phase acquisition, or frequency sweeping, or frequency pre-tuning can be used. As an example, frequency pre-tuning, where a separate tuning signal, which is summed together with that of the loop amplifier, can be used to pre-tune the oscillator and bring it's frequency close enough to the target frequency, i.e. tune it within the lock-in range of the PLL, so that the PLL can acquire a lock.

For any given fraction P/Q, there may be multiple solutions for set of coefficients pi and qi (i=1,2,3, . . . , n) in eq. (7) and (8). Multiple solutions provide additional freedom in the design choices. The computation of coefficients pi and qi is iterative in nature, and can be accomplished by various available mathematical and engineering tools. If Q is not a prime number, it can be factored into a product of constituent terms, each of which is a prime number raised to an integer exponent. All coefficients pi and qi will contain some combination of products of these factors. The more factors Q has, in general, there will be more possible solutions for pi or qi. Given fosc and it's required increment (fstep), the choice of fref will directly determine the Q (as shown in eq. (10)). This indicates that for any specific range and step size requirement for the oscillator frequency, an optimum frequency fref can be found, such that a fraction expansion results in an optimum hardware implementation and performance.

For each new frequency, corresponding to a new value of P, in general, a computation of new coefficients pi or qi is required. Even for increments of P by 1, the computation may result in completely different values of these coefficients.

The ratio P/Q, being equal to fosc/fref, represents the minimum possible multiplication ratio, and is therefore equal to the theoretical lower bound of the noise multiplication factor in the loop. For this reason, it can be stated that the FRG is approaching theoretical lowest limit regarding noise multiplication factor occurring in the loop.

Since P is an integer with minimum increment of 1, the minimum available frequency increment is:

$$fstep = fref/Q \quad (9)$$

The fstep is the lowest frequency existing in the system (any other frequency in the system is an integer multiple of this frequency). Conversely, 1/fstep represents the common periodicity of the system, i.e. it is the longest period of any waveform or signal in the system, and therefore the closest distance between any two spectral components of any signal in the system is equal to fstep.

For a given reference frequency fref and frequency increment fstep, Q can be computed from eq. (9):

$$Q = fref/fstep \quad (10)$$

Individual terms in eq. (7) have frequencies equal to fref/pi, i=1,2,3, . . . , n. However, because of the digital nature, each of these signals will contain harmonics, and the output spectrum will contain numerous frequencies, as a consequence of spectral convolution of all signals present in the processing. Spectral analysis is necessary for each of the synthesized frequencies, to make sure that the spectral purity around the desired output frequency is acceptable. To obtain the spectrum of the output waveform, first a time domain pulse waveform of the signal must be obtained, and FFT computed. The time domain waveform can be obtained by computing the waveform over one full cycle equal to system periodicity (which is equal to 1/fstep, per eq. (9)) for each of the internal nodes, or only for specific nodes of interest, as the signals are being processed and/or generated in various building blocks of the synthesizer. Performing FFT will yield the spectral purity information. The minimum frequency spacing between any two spectral lines can not be less than the frequency of fstep and depending on the particular values of coefficients pi or qi, there may or may not be any energy around the desired signal at separation equal to fstep or multiples of it. If the spectral purity is not satisfactory, a new fraction expansion solution should be found, and spectral analysis repeated. If a satisfactory solution can not be found with any fraction expansion, an option to employ external filtering of one or more internal signals can be considered. This would require a signal to exit the IC for external filtering, pass through a filter (the signal will at this point become an analog signal) and re-entry into the IC through some type of a comparator which will convert the analog signal back to digital. As an example of such comparator, a single gate, with DC feedback (through a resistor) from output back to input can be used.

To illustrate the design process in the present invention, an example of fraction expansion and signal synthesis per eq. (7) is provided:

1. Given fref=72 MHz,
2. Synthesize fosc=75.63125 MHz
3. First, find the greatest common factor for the two frequencies (or alternatively, least common periodicity of the periods of the two signals). A frequency of 6.25 kHz is found (72 MHz=11,520*6.25 kHz and 75.63125 MHz=12,101*6.25 kHz). Note that 12,101 is a prime number, whereas 11,520 can be factored as $11,520 = 2^8 * 3^2 * 5$
4. Form a ratio fosc/fref=P/Q==12,101/11,520
5. Expand the ratio per eq. (7): 12,101/11,520=1+1/20+1/2304 (Note: 20=4*5= $2^2 * 5$ and 2304= $2^8 * 3^2$, i.e. each term is a product of subsets of factors of 11,520)
6. Implement per FIG. 2, with the following specific values:
   p1 division ratio=20 (resulting frequency is 72 MHz/20=3.6 MHz)
   p2 division ratio=2304 (resulting frequency is 72 MHz/2304=31.25 kHz)
   First SSB mixer uses USB
   Second SSB mixer uses USB
7. Compute in time domain the output waveform and perform the FFT; examine the spectrum in the vicinity of desired output frequency (75.63125 MHz) and, based on the spectral content maximum, determine the loop bandwidth for the required sideband purity of the oscillator signal. While the lowest fractional frequency in item 6. above is 31.25 kHz (which is a $5^{th}$ harmonic of 6.25 kHz), by spectral analysis of the output waveform it is found that the spectrum contains a 12.5 kHz term ($2^{nd}$ harmonic of 6.25 kHz) offset from the main signal at 75.63125 MHz, at a level about 50 dB below the main signal. This signal would be converted in a phase detector down to 12.5 kHz baseband frequency. For instance, for sideband purity of 70 dB of the output oscillator, the maximum loop bandwidth of a third order loop could be about 6 kHz, since it will provide about 20 dB rejection at 12.5 kHz.
8. If necessary, obtain a different fraction expansion solution, e.g.: 12,101/11,520= 1+¼*(1/5+1/9)−1/8*1/4*(1−1/8) and repeat the process. By spectral analysis in this case, it was found that a lowest frequency term of 31.25 kHz will exist at the output of the phase detector, at about −40 dB. In this case, a third order loop with LBW of about 10 kHz can be used, for the same 70 dB purity of the output signal.

The noise multiplication figure in the loop is only 20 log(75.63125/72)=0.4 dB. For a step size of 6.25 kHz, the prior art PLL of a dual modulus type would have 20 log(12,101)=81.6 dB of noise gain. This example illustrates a dramatic improvement that can be achieved with the present invention.

Detailed description of the preferred embodiments of the present invention is presented below.

The first preferred embodiment of the present invention is shown in FIG. 4a. The Rational Synthesizer in this example has been designed to synthesize a frequency of 969.9875 MHz, which is used as a local oscillator in a CATV upconverter. The upconverter is of a dual conversion type, where this signal is used as a local oscillator LO1 in the first upconversion stage. This frequency is offset by 12.5 kHz from a 970 MHz frequency. The offset of 12.5 kHz is required by FCC regulation for some channels, as discussed earlier. For some other channels, which require an offset of 25 kHz, this synthesizer can be tuned to a frequency of 969.975 MHz. For all other channels which do not require offsets, the synthesizer can be tuned to 970 MHz frequency.

We'll focus the discussion to a 12.5 kHz offset case, i.e. fosc=969.9875 MHz Since the fosc frequency exceeds the maximum clock rate of the digital IC (ASIC) selected for this application (which has about 200 MHz maximum clock rate), an external divider of a division ratio of 8 had to be used.

A system clock frequency of 72 MHz was chosen. The choice of this frequency was based on several considerations, the first being the factorization of this frequency in respect to 12.5 kHz. Other considerations included the design aspects of a crystal oscillator used as a physical source. To utilize the full benefit of the ASIC's speed, a 72 MHz clock was doubled-up to a 144 MHz clock, for use as a reference frequency fref. The doubling was accomplished within the same ASIC (the doubler is not shown in FIG. 4a, since a standard technique with gate delays and XOR gates, well known in the art was used).

Both fosc and fref are integer multiples of 12.5 kHz. The rational expansion was chosen per the combination of eq. (7) and (8):

$$fosc=[(8*(1-1/6)+\frac{1}{2}*(1/2+1/45)*/4*(1+1/16)]*fref \quad (11)$$

To check the computation in terms of frequencies, substituting 144 MHz for fref in eq. (11):

$$fosc=1152*(1-1/6)+18*(1/2+1/45)*(1+1/16)$$
$$=8*120+9.9875=969.9875 \text{ MHz} \quad (12)$$

Each of the terms in eq. (11) represents some physical frequency. The sequence of arithmetic operations in the above formula will affect which physical frequencies are generated (i.e. by commutating the arithmetic operations, different frequencies will be generated). The sequence of the arithmetic operations and the actual frequencies in this embodiment can be found in FIG. 4a.

To shift the oscillator frequency to 960 MHz, an RF quadrature modulator circuit IC, operated as an SSB mixer is used. The quadrature modulator is fed, on one side by the output signal of the oscillator, serving as a local oscillator (LO) in the quadrature modulator, and on the other side by a signal of frequency fm=9.9875 MHz serving as a modulation signal supplied by the ASIC. The LO signal is internally in the IC split in quadrature, whereby 0° and −90° components provide the LO drive to their respective mixers in the quadrature modulator. The fm signal is also split in quadrature, in the ASIC. The output of the quadrature modulator will contain only one sideband, either lower sideband (LSB) or upper sideband (USB), depending upon the phase of the quadrature component of fm. If this component lags by 90°, an LSB signal will be generated. If this component leads by 90°, an USB sideband will be generated. The phasing is chosen for LSB, so that output of the quadrature modulator will be at frequency fosc−fm=960 MHz. This signal is presented to the divide-by-8 prescaler/divider, which produces the frequency of 120 MHz at it's output.

This frequency is compared in a phase detector with another 120 MHz signal, generated from 144 MHz reference clock signal with the FRG inside the ASIC. This frequency is generated by dividing 144 MHz by 6, where 24 MHz quadrature signals are produced, and mixing this signal in an LSB mixer (such as one in FIG. 6b) with 144 MHz (the 144 MHz quadrature signal is obtained with a precise delay through several gates), to produce 120 MHz. The output of the phase detector is supplied to a loop filter, which drives the tuning line of the oscillator and closes the PLL circuit, so that a phase lock of the oscillator is established.

Returning back to considerations regarding spectral purity implications as a result of practical limitations in the performance of the quadrature modulator, it is not difficult to find that in addition to the desired sideband, the output spectrum will contain other, undesired terms, caused by imbalances in the in-phase and quadrature signal paths. In addition to a desired fosc−fm term, there will also be undesired terms, which will at minimum include the LO leakage at fosc frequency, the other sideband at fosc+fm frequency, as well as the direct leakage of the modulation signal at fm frequency. In addition, it is likely that numerous other sidebands caused by harmonics of modulation frequency fm will exist. All these terms must be regarded as spurious components, and each of those can potentially degrade the spectral purity, if it falls within or close to the LBW after being processed in the synthesizer. The relative power of these terms at the output of the quadrature modulator will depend upon the amount of imbalance and amount of direct leakage around the circuit. With the typical quadrature modulator IC in a reasonably well designed application circuit, the level of undesired signals of no less than −30 dBc could be expected. Since the fm signal in the first preferred embodiment of the invention is a digital signal, it will contain harmonics of the fundamental frequency fm, where the level of specific harmonics will depend upon the duty cycle, as well as on the rise time of the pulses. If the duty cycle is close to 50%, predominantly odd order harmonics of fm will be present (3 fm, 5 fm, etc.), and with fast rise time of the pulses, the third harmonic could reach as high as −10 dBc levels. A spectrum of such digital signal is displayed in FIG. 9a, normalized to a frequency of 1 Hz, for clarity.

When such a complex spectrum is presented to the input of a prescler or divider, the first effect that will occur is the limiting of the signal on the strongest tone. The limiting will convert any AM that may be present into PM, which will result in a bi-level signal (i.e. the limiting will effectively convert an analog signal into digital). Next, a so called capture effect similar to the one known in FM systems will occur, where the divider will lock on and divide the frequency of the strongest tone (which is the fosc−fm in this case), while other terms will appear as PM modulation on this tone. The PM modulation terms will produce sidebands that are spread around the fosc−fm signal at the distance equal to the integer multiples of fm. In the division process, only the frequency of fosc−fm will be divided down, while the PM terms, being the modulation sidebands will remain at the same distance from the main tone after division, only the levels of those terms will be reduced by a division factor, which is consistent with the PM or FM modulation index scaling phenomena associated with a process of division, where only the sideband level, not the frequency distance, gets reduced by a factor equal to the division ratio. However, reduced spur levels through the division process will offer no relief to the spectral purity conditions, since all the terms appearing in the vicinity of the LBW at the output of phase-frequency detector will be multiplied back by the PLL loop by the (exact same amount equal to the division ratio. After the entire division process in this example, the spectral content of the signal presented to the phase-frequency detector will include the main tone at 120 MHz, surrounded by other terms at 9.9875 MHz spacing. The negative frequencies (if any, depending on the division ratio) will fold back around DC to positive ones.

A 120 MHz signal applied to the other side of the phase detector contains it's own sidebands. The phase-frequency detector will perform the operation of multiplication of the two signals (in time domain, which is equivalent to the operation of mixing in the frequency domain), which will produce the spectrum equal to the convolution of the spectrums of the two signals. In the mixing process, all spectral components present around 120 MHz and it's harmonics will translate to spectral components around DC at the output of the phase detector. The distance of these components from DC will be equal to the distance of the original components from the main signal.

In real implementation in a digital ASIC, there may be a case of adverse (undesired) coupling of the signals through internal structures of the IC (such as substrate, bond wires, etc.) that in general can degrade spectral purity and produce spectral components which are not expected per the results of computations or simulations. To minimize such effects, it is beneficial to use differential (complementary) signals wherever possible, in order to utilize well known benefits of reduced coupling and cross-talk of such signals, as well as to optimize internal layout of the IC.

The frequency fm=9.9875 MHz in eq. (12), is generated by a circuit shown in FIG. 4b.

Note: In this, and other figures, a letter $\phi$ is used to indicates that division produces quadrature components, i.e. that it has two outputs $-0°$ and $90°$.

The manner in which this signal is generated follows directly from eq. (11). First, 144 MHz reference signal is split in two signals, one divided by 2 in quadrature (using a circuit of FIG. 8) and another divided by 45, also in qudrature. The dividers used for division by 45 are similar in nature to that of FIG. 8, except that the quadrature signals are not exactly 90° apart (88° in this example, as indicated in FIG. 4b.). In general, division by non-binary numbers can not produce exact quadrature, however with a proper choice of division sequence, choice of triggering (either on the raising edge or on the falling edge) and choice of signal polarity, the quadrature conditions can be approached close enough, so that degradation of the SSB signal (i.e. reduced rejection of the unwanted sideband or signal feed-through) is acceptable. The two signals are next applied to an USB mixer, such as one shown in FIG. 6a., to produce a 75.2 MHz signal, which is further divided by two, to a 37.6 MHz frequency, which is in turn mixed in another USB mixer with it's version divided by 8, to finally produce a signal at 9.9875 MHz.

Figure 9A:
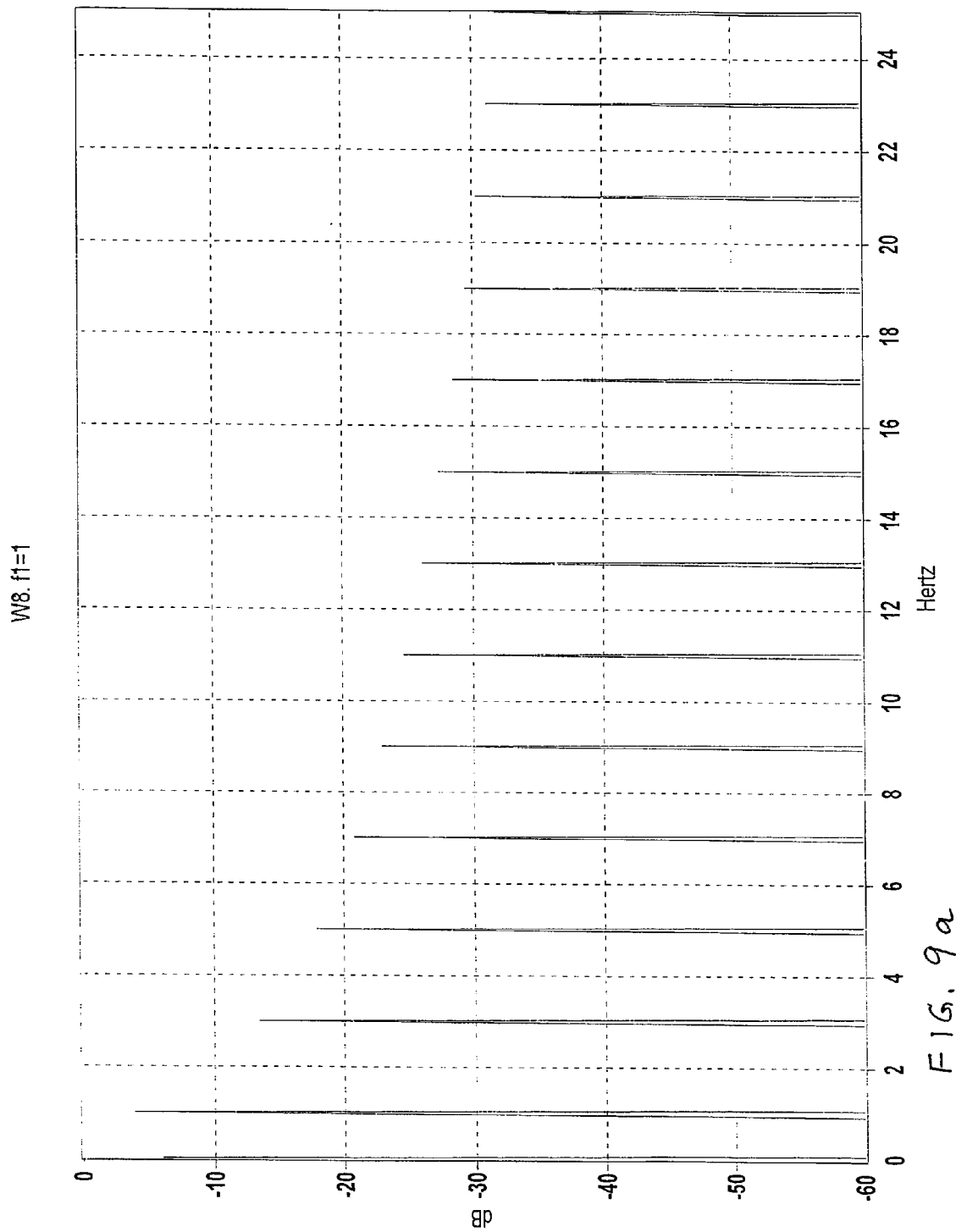
FIG. 9a is an example of a spectrum of a 1 Hz baseband digital signal of the first frequency in SSB mixer
Figure 9B:
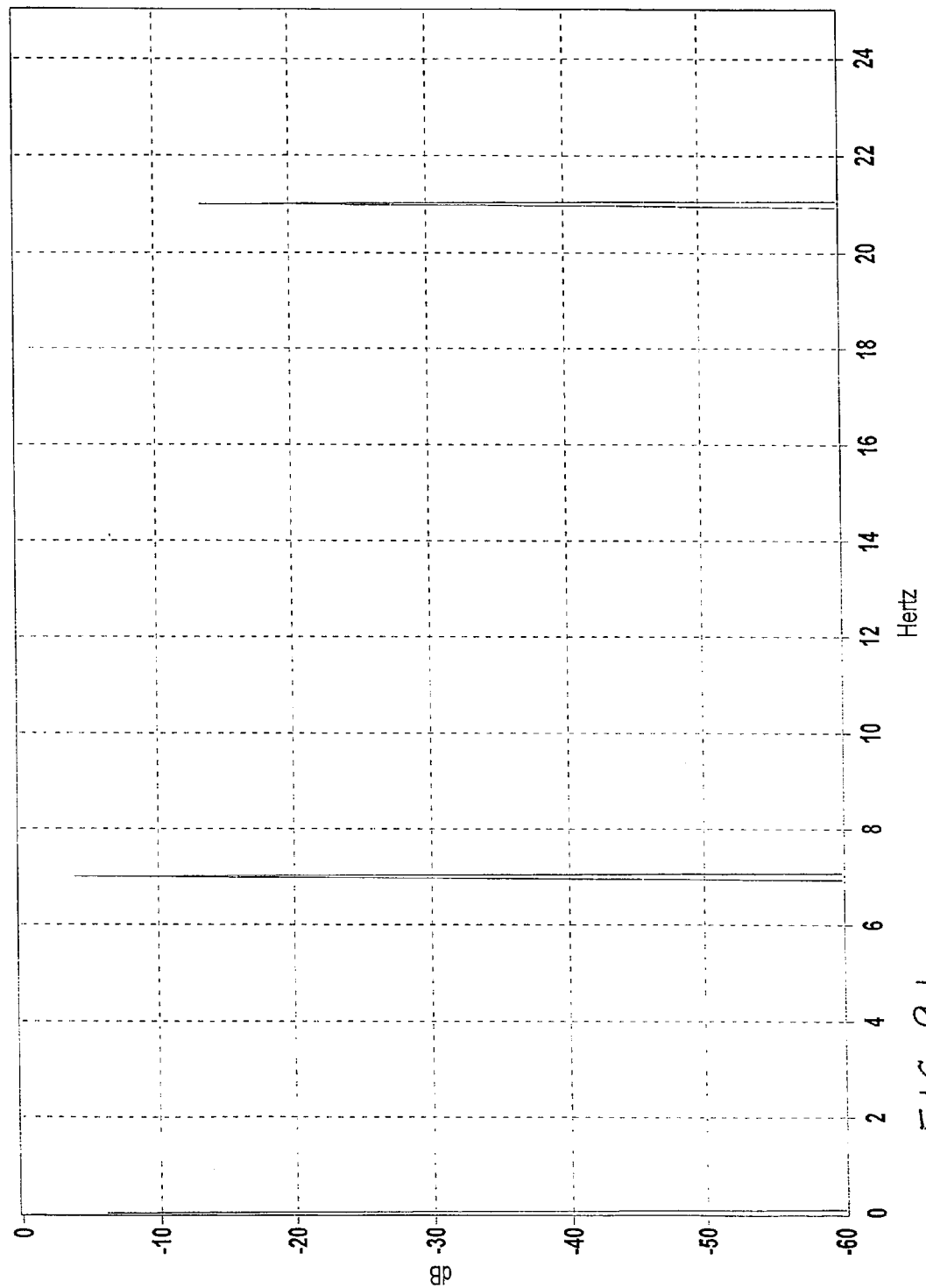
FIG. 9b is an example a spectrum of a 7 Hz baseband digital signal the second frequency in SSB mixer
Figure 9C:
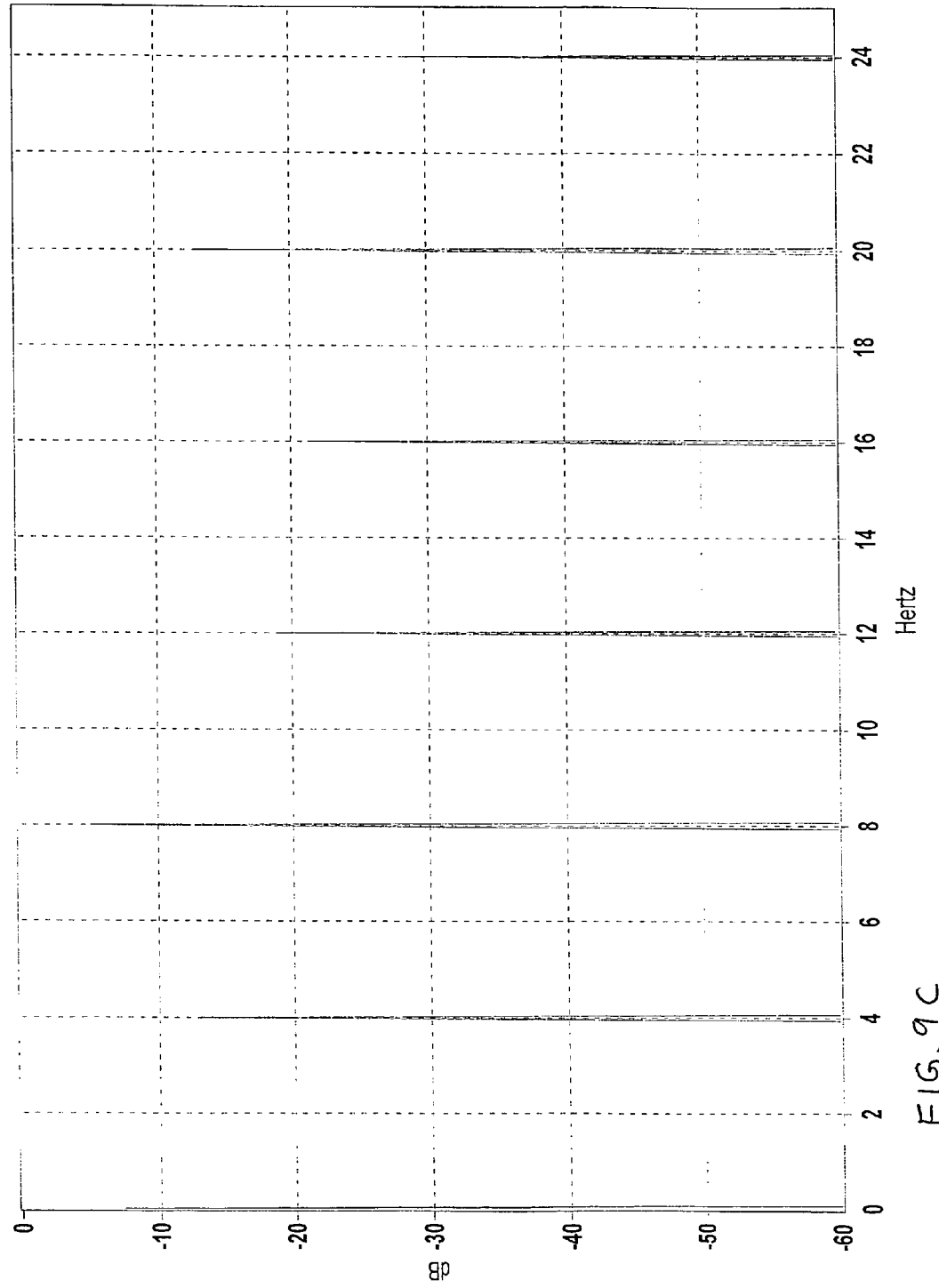
FIG. 9c is a spectrum of a digital signal with dominant energy at 8 Hz, as a result of USB mixing of the signals in FIGS. 9a and 9b

To illustrate spectral conditions at the output of a digital SSB mixer (with normalized frequencies down to a few Hz for clarity), in FIG. 9c a spectrum of a digital signal with dominant energy at 8 Hz, as a result of USB mixing of the signals in FIGS. 9a and 9b, using the circuit of FIG. 6a is shown.

Figure 9D:
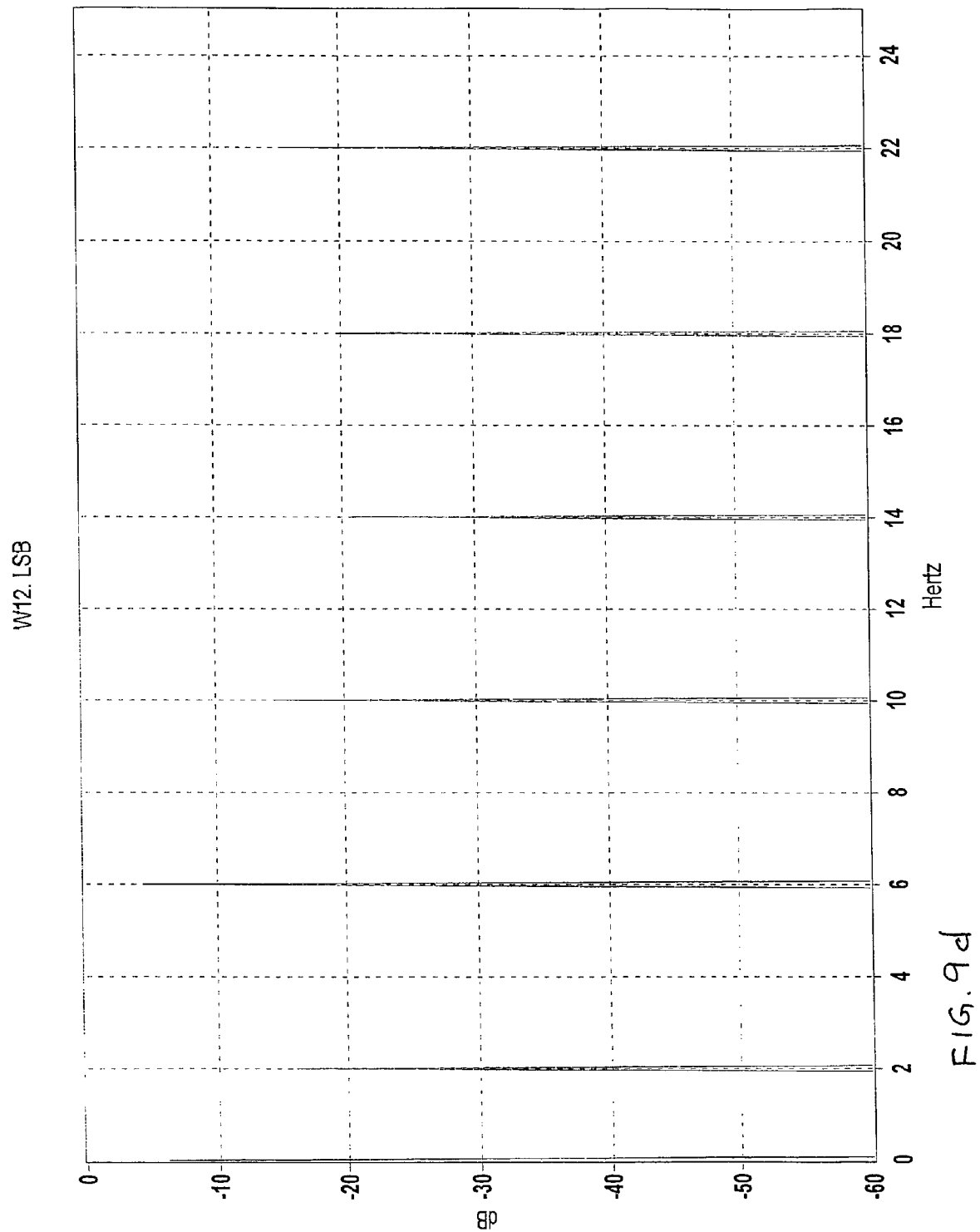
FIG. 9d is a spectrum of a digital signal with dominant energy at 6 Hz, as a result of LSB mixing of the signals in FIGS. 9a and 9b

As another illustration of a spectrum at the output of a digital SSB mixer, in FIG. 9d a spectrum of a digital signal with dominant energy at 6 Hz, as a result of LSB mixing of the signals in FIGS. 9a and 9b, using the circuit of FIG. 6b is shown.

Figure 10A:
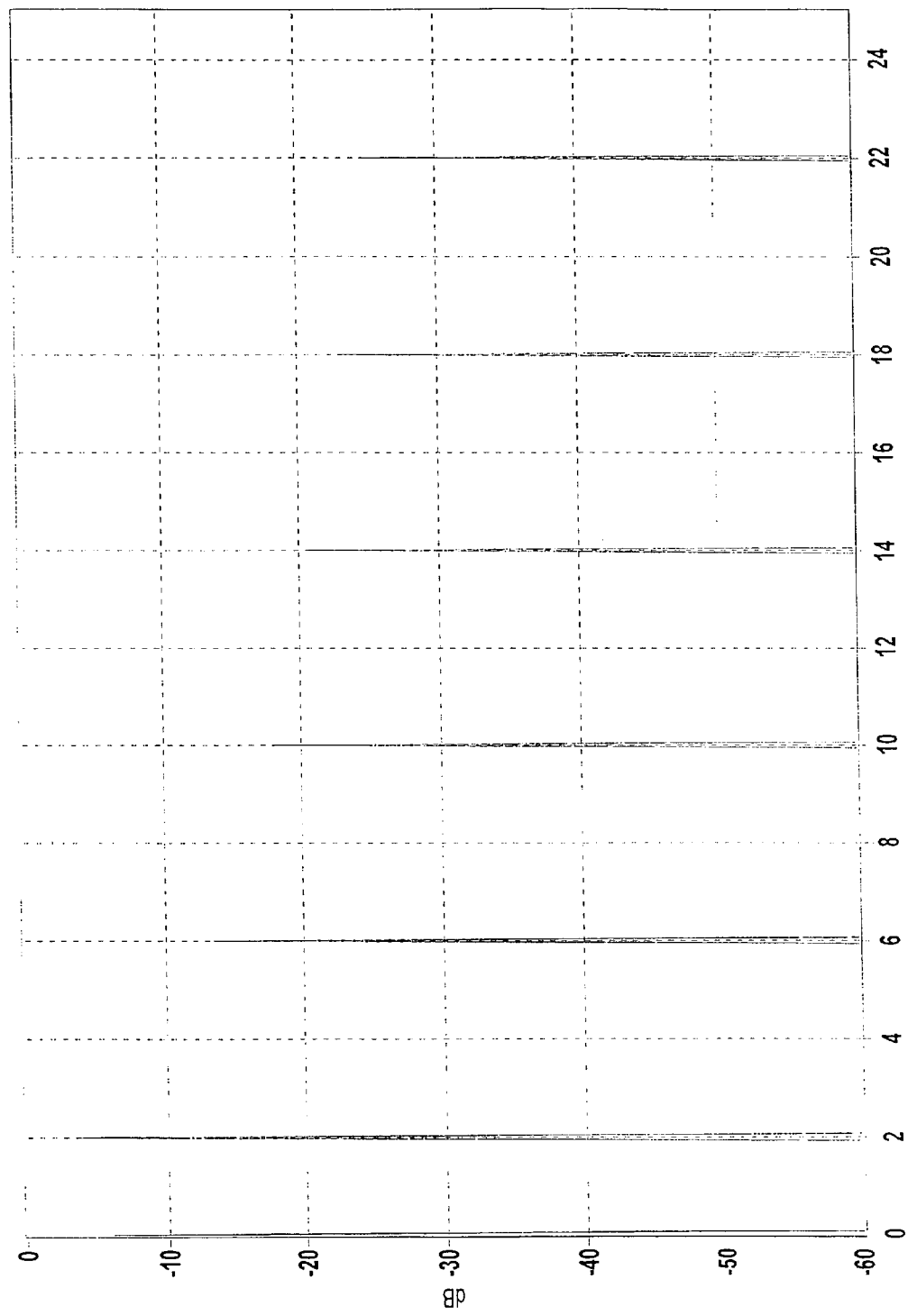
FIG. 10a is a spectrum of a digital signal as a result of a divide-by-4 of the USB digital signal of FIG. 9c, with dominant energy at 8/4=2 Hz

To illustrate the spectral conditions at the output of a digital divider when dividing an SSB signal, in FIG. 10a a spectrum of a digital signal as a result of a divide-by-4 of the USB digital signal of FIG. 9c, with dominant energy at 8/4=2 Hz is shown.

Figure 10B:
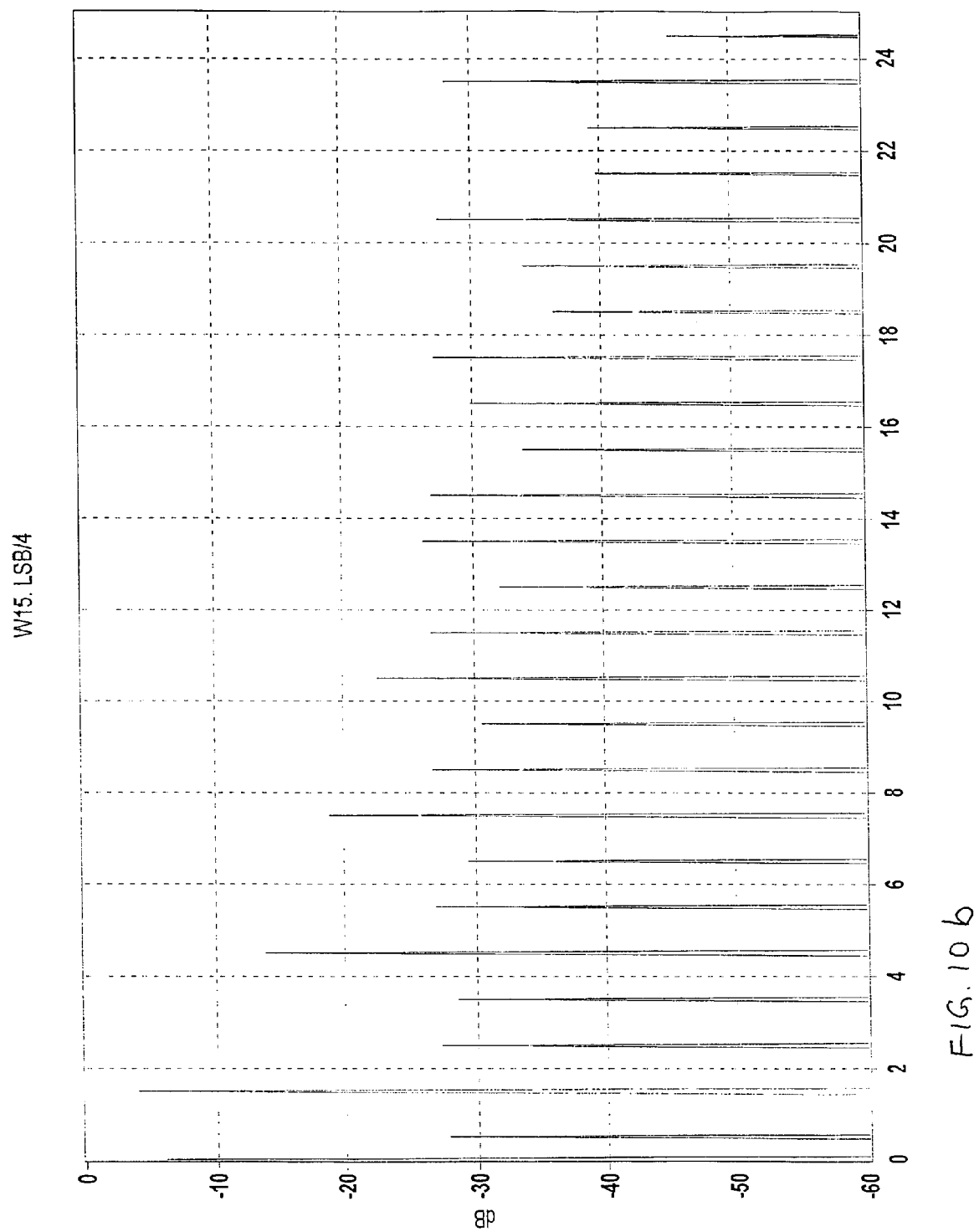
FIG. 10b is a spectrum of a digital signal as a result of a divide-by-4 of the LSB digital signal of FIG. 9d with dominant energy at 6/4=1.5 Hz

As another illustration of the spectrum at a digital divider when dividing an SSB signal, in FIG. 10b a spectrum of a digital signal as a result of a divide-by-4 of the LSB digital signal of FIG. 9d with dominant energy at 6/4=1.5 Hz is shown.

The spectral plots in the figures above were obtained by computing time domain waveforms and applying FFT transform.

A block diagram of a wide range tunable synthesizer, operating in 1 GHz to 2 GHz frequency range, with 1 MHz step resolution is shown in FIG. 5a. The application of this synthesizer is in the same CATV upconverter, except this signal is used as a local oscillator L02 in the second upconversion stage. The circuit uses an external digital divide-by-two circuit followed by an analog (RF) quadrature modulator IC operated in SSB mode to provide a translation of the local oscillator frequency, further followed by a fixed digital divide-by-8 IC in order to scale the frequency down to about 130 MHz and below, which is within the operating range of a chosen digital ASIC (or FPGA).

The fraction expansion can be performed in a similar manner as in the previous example. As a result of such expansion, various frequencies internally needed in the FRG, in order to synthesize all required oscillator frequencies can be computed. The embodiment of the fraction expansion and the generation of all required frequencies is shown in FIG. 5b and FIG. 5c. All frequencies shown in these figures are derived from 144 MHz reference signal, in a similar manner as in the first example, using similar circuits for the division and SSB mixing process.

An embodiment of an improved phase detector over the prior art is shown in FIG. 11. This phase detector employs SSB mixing of the two compared frequencies, where each frequency has quadrature signals (I=0° in phase and Q=90' quadrature signal). The circuit in FIG. 11 is similar to a quadrature modulator circuit, except the phasing is somewhat different. The mixers are of analog type. Compared with a detector of the prior art, this phase detector has a higher gain by a factor of two, since full converted power is contributing to the detection of phase, and a 3 dB better noise figure. The prior art phase detector uses one mixer only, where half the power (the power in the upper sideband) is not used to contribute to the detection of phase difference of two signals.

An embodiment of the SSB phase comparator with digital circuits is possible, where analog mixers are replaced with XOR gates, and the I and Q signals at the output of the XOR gates are summed together by a resistive network.

An embodiment of a digital phase-shift circuit, which provides phase control capability is shown in the block diagram in FIG. 12. An example of 45.75 MHz signal is shown, where full 360 degrees phase control with 1.25° step resolution is available. This signal (or a signal of different frequency constructed in a similar way), can be added/ subtracted to another signal by SSB mixing and so obtaining a phase controlled signal at any desired frequency. Through SSB mixing, the phase control range and step size will remain unchanged, since the SSB mixing is an additive process, both for frequency and phase.

What is claimed is:

1. A phase lock loop device comprising:
a voltage controlled oscillator (VCO) having an output frequency Fosc;
a loop filter coupled to said VCO;
a phase detector coupled to said loop filter and said VCO;
a frequency ratio generator, FRG coupled to said phase detector, said FRG receiving a reference signal having a reference frequency Fref and generating a comparison frequency signal G1 whose dominant frequency component Fc is a desired frequency Fosc based on a fraction expansion of a ratio P/Q of said desired frequency Fosc and said reference frequency Fref,
wherein P and Q are integer numbers, said ratio P/Q being realized according to a mathematical expression $1\pm1/p_1\pm1/p_2\pm \ldots 1/p_n$, or realized according to a mathematical expression $1\pm1/q_1\cdot\{1\pm1/q_2\cdot[\ldots(1\pm\ldots 1/q_m)))\ldots]\}$, or realized according to a combination of said mathematical expressions,
wherein n, m, and coefficients $p_1, p_2, \ldots, p_n, q_1, q_2, \ldots q_m$ are positive integer numbers, and
whereby all additions in said mathematical expressions are realized by an upper side-band SSB mixer, all subtractions are realized by a lower-side-band SSB mixer, and all fractions $1/p_1$ through $1/p_n$ and $1/q_1$ through $1/q_m$ are realized by frequency dividers.

2. The device of claim 1, wherein said fraction expansion of said ratio P/Q is optimized for best spectral purity at the vicinity of said VCO output signal frequency Fosc, whereas said fraction expansion is also chosen to have terms that are most favorable for optimum hardware realization.

3. The device of claim 1, wherein one or more of the ratios of said frequency dividers is programmable, and the sideband of one or more of said SSB mixers is selected to be either the upper sideband (USB) for additions or the lower sideband (LSB) for subtractions.

4. The device of claim 3, wherein a plurality of equidistant discrete frequency steps continuous within a determined frequency range are programmed such that each step has a different dominant frequency Fc selectable among said plurality of equidistant discrete frequency steps within said determined frequency range.

5. The device of claim 1, wherein said comparison frequency signal is a complex signal consisting of two constituent components being an in-phase component and a quadrature component having a dominant frequency Fc,
wherein said VCO output signal is split into a complex VCO output signal having two constituent components being an in-phase component and a quadrature component having a dominant frequency Fosc; and
wherein said complex signal having a dominant frequency Fc is phase locked to said complex VCO output signal having a frequency Fosc by using said phase detector based on a SSB mixer to generate a phase detector output provided to said loop filter.

6. The device of claim 1, further comprising:
a frequency divider for dividing the frequency of said VCO output signal by an integer M to provide a signal of frequency Fosc/M to said phase detector,
wherein said signal of frequency Fosc/M is phase locked with said reference signal having dominant frequency component Fc=P/Q·Fref through said phase detector to generate a phase detector output such that said frequency Fosc/M becomes substantially equal to said dominant frequency Fc satisfying the relationship Fosc=M·Fc=M·P/Q·Fref.

7. The device of claim 1, wherein:
said reference frequency Fref is a bi-level (digital) signal having a dominant frequency;
said SSB mixer is a complex bi-level (digital) mixer;
said phase detector is a bi-level (digital) phase detector;
said VCO output signal is sliced into a bi-level (digital) signal having said dominant frequency Fosc.

8. The device of claim 1, wherein the phase of said comparison frequency signal generated having the dominant frequency Fc is programmed in discrete equal steps to control the phase of said VCO output signal in discrete equal steps covering a full period of 360° of one cycle of said VCO output signal.

9. The device of claim 1, further comprising:
a second Frequency Ratio Generator FRG2,
wherein said reference frequency Fref is received at an input of said FRG2 to produce a second output signal G2 at an output of said FRG2 having a dominant frequency Fg2=U/V·Fref, U/V, being a ratio of two positive integers,
wherein said VCO output signal is offset by said dominant frequency Fg2 of said second output signal G2 either in the positive sense using a USB mixer or in the negative sense using an LSB mixer to produce an offset VCO signal having a dominant frequency of Fosc±Fg2,
wherein said signal G1 has said dominant frequency Fc phase locked with said offset VCO signal having a frequency Fosc±Fg2 through said phase detector to generate a phase detector output such that said frequency Fosc±Fg2 becomes substantially equal to said dominant frequency Fc satisfying the relationship Fosc=Fc±Fg2=(P/Q±U/V)·Fref;
a second loop filter for filtering said phase detector output to generate a second loop filter output; and
a VCO output signal generated by transmitting said second loop filter output to a tuning input of said VCO.

10. A method of phase-lock loop (PLL) frequency synthesis, the method comprising:
receiving a reference signal having a reference frequency Fref in a frequency ratio generator FRG;
generating through a voltage controlled oscillator (VCO) a VCO output signal having a frequency Fosc;
coupling said VCO output signal to a first input of a phase detector;
filtering an output of said phase detector to obtain a filtered signal for coupling said filtered signal to said VCO;
coupling said reference signal from said FRG to a second input of said phase detector, said FRG generating a comparison frequency signal G1 whose dominant frequency component Fc is a desired frequency Fosc based on a fraction expansion of a ratio P/Q of said desired frequency Fosc and said reference frequency Fref,
wherein P and Q are integer numbers, said ratio P/Q being realized according to a mathematical expression $1\pm1/p_1\pm1/p_2\pm \ldots 1/p_n$, or realized according to a mathematical expression $1\pm1/q_1\cdot\{1\pm1/q_2\cdot[\ldots(1\pm1/q_m)))\ldots]\}$, or realized according to a combination of said mathematical expressions,
wherein n, m and coefficients $p_1, p_2, \ldots, p_n, q_1, q_2, \ldots, q_m$ are positive integer numbers, and whereby all additions in said mathematical expressions are realized by upper side-band SSB mixing, all subtractions are realized by lower-side-band SSB mixing, and all fractions $1/p_1$ through $1/p_n$ and $1/q_1$ through $1/q_m$ are realized by frequency division.

11. The method of claim 10, further comprising:
optimizing a fraction expansion of said ratio P/Q for best spectral purity at the vicinity of said VCO output signal frequency Fosc,
optimizing said fraction expansion for most favorable hardware realization.

12. The method of claim 10, further comprising:
controlling said dominant frequency Fc of said generated signal G1 in order to obtain a plurality of desired frequencies by programming one or more of said coefficients of said fraction expansion by programming one or more of the ratios of said frequency divisions, and by selecting the sidebands of one or more of said SSB mixing to be either the upper sideband (USB) for additions or the lower sideband (LSB) for subtractions.

13. The method of claim 12, further comprising:
programming a plurality of equidistant discrete frequency steps that are continuous within a determined frequency range, each step having a different dominant frequency Fc selectable among the plurality of said discrete frequency steps within said determined frequency range.

14. The method of claim 10, further comprising:
maximizing a loop bandwidth by selecting combinations of said coefficients of said fraction expansion and said ratios of said frequency division, and said additions by upper side-band SSB mixing (USB) and said subtractions by lower-side-band SSB mixing (LSB) such that a closest significant spurious spectral component to said dominant frequency Fc is at an offset frequency from Fc that is substantially greater than a frequency step size within a determined frequency range, such that the loop bandwidth determined by said loop filter is substantially greater than said frequency step size.

15. The method of claim 10, wherein said comparison frequency signal is a complex signal consisting of two constituent components being an in-phase component and a quadrature component having a dominant frequency Fc; and further comprising:
splitting said VCO output signal into a complex VCO output signal having two constituent components being an in-phase component and a quadrature component having a dominant frequency Fosc; and
phase locking said comparison frequency signal having said dominant frequency Fc with said complex VCO output signal having a frequency Fosc using said complex phase detector based on SSB mixing such that a phase detector output is provided to said loop filter.

16. The method of claim 10, further comprising:
dividing the frequency of said VCO output signal by an integer M to obtain a signal of frequency Fosc/M to said phase detector;
phase locking said signal of frequency Fosc/M with said reference signal having a dominant frequency component Fc=P/Q·Fref through said phase detector generating a phase detector output such that said frequency Fosc/M becomes substantially equal to said dominant frequency Fc satisfying the relationship Fosc=M·Fc=M·P/Q·Fref.

17. The method of claim 10, further comprising:
controlling the phase of said VCO output signal by controlling the phase of said comparison frequency signal having a dominant frequency Fc by programming said phase of said comparison frequency signal in discrete equal steps covering a full period of 360° of one cycle of said VCO output signal.

18. The method of claim 10, further comprising:
receiving said reference signal having a reference frequency Fref at an input of a second Frequency Ratio Generator (FRG2) to produce a second output signal G2 at an output of said FRG2 having a dominant frequency Fg2=U/V·Fref, U/V, being a ratio of two positive integers;
offsetting said VCO output signal by said dominant frequency Fg2 of said second output signal G2 either in the positive sense using USB mixing or in the negative sense using LSB mixing, producing an offset VCO signal having the dominant frequency of Fosc±Fg2;
phase-locking said generated signal G1 having said dominant frequency Fc with said offset VCO signal having a frequency Fosc±Fg2 through said phase detector, generating a phase detector output such that said frequency Fosc±Fg2 becomes substantially equal to said dominant frequency Fc satisfying the relationship Fosc=Fc±Fg2=(P/Q±U/V) Fref;
filtering said phase detector output through a second loop filter generating a second loop filter output; and
transmitting said second loop filter output to a tuning input of said VCO producing said VCO output signal.

19. A Frequency Ratio Generator (FRG) frequency translation device, comprising:
an input signal having a frequency Fin; and
an output signal having a dominant frequency Fg=P/Q Fin, P/Q being a ratio of two positive integers equal to one of a first fraction expansion $1\pm1/p_1\pm1/p_2\pm\ldots 1/p_n$, a second fraction expansion $1\pm1/q_1\cdot\{1\pm1/q_2\cdot[\ldots(1\pm1/q_m)))\ldots]\}$, or a mathematical expression which is a combination of said first and second fraction expansions, m, n and coefficients $p_1, p_2, \ldots, p_n, q_1, q_2, \ldots, q_m$ being positive integer numbers, all additions being realized by an upper side-band SSB mixer (USB), all subtractions by a lower-side-band SSB mixer (LSB) and all the fractions $1/p_1$ through $1/p_n$ and $1/q_1$ through $1/q_m$ by a frequency divider.

20. The device of claim 19, further comprising:
a filter coupled to said output signal.

21. A method of Frequency Ratio Generation (FRG) frequency translation, the method comprising:
receiving an input signal having a frequency Fin;
generating a signal whose dominant frequency component Fg is equal to a ratio P/Q multiplied by said frequency Fin,
wherein P and Q are integer numbers,
said ratio P/Q being realized according to a mathematical expression $1\pm1/p_1\pm1/p_2\pm\ldots 1/p_n$, or realized according to a mathematical expression $1\pm1/q_1\cdot\{1\pm1/q_2\cdot[\ldots(1\pm1/q_m)))\ldots]\}$, or realized according to a combination of said mathematical expressions;
wherein n, m and coefficients $p_1, p_2, \ldots p_n, q_1, q_2, \ldots, q_m$ are positive integer numbers, and
whereby all additions in said mathematical expressions are realized by upper side-band SSB mixing, all subtractions are realized by lower-side-band SSB mixing and all fractions $1/p_1$ through $1/p_n$ and $1/q_1$ through $1/q_m$ are realized by frequency division.

22. The method of claim 21, further comprising:
filtering said generated signal.

23. A phase-lock loop (PLL) frequency synthesizer device, comprising:

a Frequency Ratio Generator (FRG) frequency translator, comprising:

an input signal having a frequency Fin; and an output signal having a dominant frequency Fg=P/Q Fin, P/Q being a ratio of two positive integers equal to one of a first fraction expansion $1\pm1/p_1\pm1/p_2\pm \ldots 1/p_n$, a second fraction expansion $1\pm1/q_1\cdot\{1\pm1/q_2\cdot[ \ldots (1\pm1/q_m))) \ldots ]\}$, or a mathematical expression which is a combination of said first and second fraction expansions, m, n and coefficients $p_1, p_2, \ldots, p_n, q_1, q_2, \ldots, q_m$ being positive integer numbers, all additions being realized by using an upper side-band SSB mixer (USB), all subtractions by a lower-side-band SSB mixer (LSB) and all the fractions $1/p_1$ through $1/p_n$ and $1/q_1$ through $1/q_m$ by a frequency divider;

an input reference signal having a reference frequency Fref;

a voltage controlled oscillator (VCO) output signal having a frequency Fo coupled to said input of said FRG to produce said output signal at an output of said FRG having a dominant frequency Fg=R/S·Fo, R/S being a ratio of two positive integers, wherein said output signal having said dominant frequency Fg is phase locked with said input reference signal having a reference frequency Fref through a phase detector to generate a phase detector output such that said frequency Fg becomes substantially equal to said reference frequency Fref satisfying the relationship Fo=S/R·Fref;

a loop filter for filtering said phase detector output to generate a loop filter output; and a VCO output signal generated by transmitting said loop filter output to a tuning input of said VCO.

24. A method of phase-lock loop (PLL) frequency synthesis using a Frequency Ratio Generator (FRG) frequency translation, the method comprising:

receiving an input signal having a frequency Fin at an input of said FRG;

producing an output signal at an output of said FRG having a dominant frequency Fg=P/Q·Fin, P/Q being a ratio of two positive integers equal to one of a first fraction expansion $1\pm1/p_1\pm1/p_2\pm \ldots 1/p_n$, a second fraction expansion $1\pm1/q_1\cdot\{1\pm1/q_2\cdot[ \ldots (1\pm1/q_m))) \ldots ]\}$, or a mathematical expression which is a combination of said first and second fraction expansions, m, n and coefficients $p_1, p_2, \ldots, p_n, q_1, q_2, \ldots, q_m$ being positive integer numbers, realizing all additions by upper side-band SSB mixing (USB), all subtractions by lower-side-band SSB mixing (LSB) and all the fractions $1/p_1$ through $1/p_n$ and $1/q_1$ through $1/q_m$ by frequency division; and receiving an input reference signal having a reference frequency Fref;

generating through a voltage controlled oscillator (VCO) a VCO output signal having a frequency Fo and coupling it to said input of said FRG, thereby producing at said output of said FRG a translated output signal having a dominant frequency Fg=R/S·Fo, R/S being a ratio of two positive integers;

phase locking said translated output signal having said dominant frequency Fg with said input reference signal having a reference frequency Fref through a phase detector, generating a phase detector output such that said frequency Fg becomes substantially equal to said reference frequency Fref satisfying the relationship Fo=S/R·Fref;

filtering said phase detector output through a loop filter generating a loop filter output; and transmitting said loop filter output to a tuning input of said VCO producing said VCO output signal.

* * * * *

UNITED STATES PATENT AND TRADEMARK OFFICE
CERTIFICATE OF CORRECTION

PATENT NO. : 6,977,556 B1
DATED : December 20, 2005
INVENTOR(S) : Petrovic et al.

It is certified that error appears in the above-identified patent and that said Letters Patent is hereby corrected as shown below:

<u>Column 22,</u>
Line 43, delete "$1^{/q}{}_1$" and replace with -- $1/q_1$ --.

<u>Column 23,</u>
Line 7, delete "Fg=P/Q" and replace with -- Fg=P/Q• --.

Signed and Sealed this

Eleventh Day of April, 2006

JON W. DUDAS
*Director of the United States Patent and Trademark Office*